United States Patent
Marumo et al.

(10) Patent No.: US 6,848,457 B2
(45) Date of Patent: Feb. 1, 2005

(54) LIQUID TREATMENT EQUIPMENT, LIQUID TREATMENT METHOD, SEMICONDUCTOR DEVICE MANUFACTURING METHOD, AND SEMICONDUCTOR DEVICE MANUFACTURING EQUIPMENT

(75) Inventors: Yoshinori Marumo, Nirasaki (JP); Yoshinori Kato, Kuwana (JP); Hiroshi Sato, Nirasaki (JP); Kyungho Park, Kawasaki (JP)

(73) Assignee: Tokyo Electron Limited, Tokyo (JP)

( * ) Notice: Subject to any disclaimer, the term of this patent is extended or adjusted under 35 U.S.C. 154(b) by 626 days.

(21) Appl. No.: 09/849,347

(22) Filed: May 7, 2001

(65) Prior Publication Data

US 2001/0039118 A1 Nov. 8, 2001

(30) Foreign Application Priority Data

May 8, 2000 (JP) .................................. P2000-135176
May 8, 2000 (JP) .................................. P2000-174446

(51) Int. Cl.$^7$ ............................................. B08B 3/04
(52) U.S. Cl. .................... 134/98.1; 134/110; 134/94.1; 134/902; 156/345.18
(58) Field of Search ................................ 134/902, 109, 134/56 R, 57 R, 94.1, 98.1, 105, 108, 110, 111; 156/345.15, 345.18, 345.24; 205/101, 82

(56) References Cited

U.S. PATENT DOCUMENTS

| | | | | |
|---|---|---|---|---|
| 3,431,187 A | * | 3/1969 | Lancy ........................ | 205/76 |
| 3,607,482 A | * | 9/1971 | Selm ........................... | 216/93 |
| 3,775,202 A | * | 11/1973 | Meek et al. .................. | 216/86 |
| 4,042,444 A | * | 8/1977 | Snyder ..................... | 156/345.15 |
| 4,159,194 A | * | 6/1979 | Steward ...................... | 23/301 |
| 4,197,167 A | * | 4/1980 | Wright, Jr. .................. | 205/100 |
| 4,252,621 A | * | 2/1981 | Reinhardt et al. ........... | 205/581 |
| 4,576,677 A | * | 3/1986 | Faul et al. ..................... | 216/93 |
| 4,652,352 A | * | 3/1987 | Saieva ........................ | 205/572 |
| 4,734,175 A | * | 3/1988 | Bissinger .................... | 205/772 |
| 5,112,392 A | * | 5/1992 | Anderson et al. ........... | 106/1.22 |
| 5,472,585 A | * | 12/1995 | Dinella et al. ............... | 427/98 |
| 5,980,771 A | * | 11/1999 | Cowan ........................ | 216/93 |
| 6,391,209 B1 | * | 5/2002 | Belongia et al. ............ | 210/748 |
| 6,503,363 B2 | * | 1/2003 | Nakano et al. ........ | 156/345.18 |
| 6,569,307 B2 | * | 5/2003 | Blachier et al. .............. | 205/82 |

FOREIGN PATENT DOCUMENTS

| | | | |
|---|---|---|---|
| EP | 669410 | * | 8/1985 |
| EP | 8-170177 | * | 7/1996 |
| WO | WO 00/52229 | * | 8/2000 |

* cited by examiner

Primary Examiner—Frankie L. Stinson
(74) Attorney, Agent, or Firm—Pillsbury Winthrop LLP

(57) ABSTRACT

Providing liquid treatment equipment capable of largely reducing a frequency of discarding a treatment solution as a whole and capable of implementing smooth and high quality liquid treatment with less manufacturing burden. Equipment comprises a treatment solution bath capable of accommodating a treatment solution for implementing liquid treatment to a substrate to treat, a treatment solution circulating system circulating the accommodated treatment solution between the outside of the treatment solution bath, and a product removal unit removing a reaction product due to the liquid treatment contained in the circulated treatment solution. By circulating the accommodated treatment solution between the outside of the treatment solution bath, reaction products contained in the circulated treatment solution are removed by means of the product removal unit. Thereby, a chemical change substance and a decomposition product remaining in a treatment solution can be removed, resulting in preventing a treatment solution from deteriorating.

7 Claims, 15 Drawing Sheets

LIQUID TREATMENT EQUIPMENT, LIQUID TREATMENT METHOD, SEMICONDUCTOR DEVICE MANUFACTURING METHOD, AND SEMICONDUCTOR DEVICE MANUFACTURING EQUIPMENT

BACKGROUND OF THE INVENTION

1. Field of the Invention

The present invention relates to liquid treatment equipment for implementing treatment in liquid on a surface of a substrate to treat and a liquid treatment method therefor, and a semiconductor device manufacturing method useful for implementing such liquid treatment and semiconductor device manufacturing equipment useful therefor. In particular, the present invention relates to liquid treatment equipment suitable for implementing smooth and high quality liquid treatment with less manufacturing burden and a liquid treatment method suitable therefor, and a semiconductor device manufacturing method useful in implementing such liquid treatment and semiconductor device manufacturing equipment useful therefor.

2. Description of the Related Art

Recently, a liquid treatment step in a manufacturing process of semiconductor devices or liquid crystal devices, with an increase of demands for finer processing in the manufacture of semiconductor devices or liquid crystal devices, is more and more frequently employed in the place of a reaction process in gaseous phase.

As an example of a liquid treatment step, a step for implementing copper plating on a wafer surface that is a substrate to treat will be explained. Such step for implementing copper plating is in general part of a step of forming a copper pattern in a fine trench or bia hole previously formed at the respective portions on the wafer surface. Each of the portions that are formed in a large number on the wafer surface is an area to be a single semiconductor device (semiconductor chip).

In implementing copper plating on the wafer surface to treat, on the surface, in advance, a conductive seed layer that passes electricity to plating to be formed and a plating solution, being a cathode in electrolytic plating and a seed in plating, is formed.

The seed layer, with a thickness of from approximately several nm to approximately 200 nm, combines a copper layer of the same material with a layer of material that is different from the later plating. When mentioning scale relationship with respect to the fine trench or bia hole formed in advance on the wafer surface, the seed layer is formed so that a surface of a sidewall thereof and a bottom surface thereof are covered. While holding a periphery of the wafer thereon such seed layer is formed, an electric conductor (contact) is effected to come into contact with the seed layer to supply electricity for plating.

The wafer thereto the electricity is supplied is immersed in a plating solution bath (treatment solution bath) for the seed layer to be the cathode. In the plating solution bath, an electrolyte solution including plating materials, an aqueous solution of copper sulfate ($CuSO_4$) for instance, is filled and an anode electrode of copper containing phosphorus for instance is disposed in contact with the aqueous solution of copper sulfate. The plating is formed so that the fine trench or bia hole previously formed on the wafer surface is filled, followed by further covering the wafer surface.

In the plating treatment, in order to fill the fine trenches or bia holes previously formed on the wafer surface without voids and to stimulate the formation of the plating, an additive agent is added to the plating solution. In the additive agent, material for stimulating (brightening) the formation of the plating (material containing sulfur, for instance) and material for repressing (suppressing) the formation of the plating (organic high molecular substance, for instance) are compounded. By the competing action of both materials for and against, high quality and efficient plating is targeted.

That is, in order to plate for a surface having trenches or bia holes to be filled without voids, it is necessary to relatively accelerate a plating reaction of the trenches or bia holes and to relatively decelerate a plating reaction of portions that are not trenches or bia holes. Of components of the additive agent, the material containing sulfur for instance that is a material for accelerating the plating formation is relatively small in particle diameter and enters into trenches or bia holes with ease. On the other hand, the material repressing the plating formation, organic polymer material for instance, is relatively large in particle diameter and enters into the trenches or bia holes with difficulty.

Accordingly, the plating is accelerated of the trenches or bia holes but decelerated of the area other than that. Thereby, the plating can be implemented in the trenches or bia holes without voids, with high quality and with high efficiency as a whole.

As mentioned above, in the liquid treatment, the additive agent plays an important role in the quality and productivity of the liquid treatment. Accordingly, the concentration of the additive in the plating solution is necessary to be always controlled, and the plating solution has to be kept agitating to prevent concentration unevenness in the plating solution from occurring. Though the concentration of the additive agent in the plating solution is measured by the use of CVS (Cyclic Voltametric Stripper), it is insufficient in view of accuracy and furthermore at present it is difficult to implement a real time measurement. (additive agent concentration management burden, agitation burden).

Furthermore, each time as the plating solution is used in the plating treatment, the additive agent is consumed and lost. In the consumption and loss, specifically, there are chemical changes due to the contact with the anode electrode, electrical, natural decomposition or the like. To such consumption and loss of the additive agent, it is possible to keep up with to a certain extent by supplying additional additive agent in the plating solution. However, due to remaining chemical change matter and decomposition products, each time as the additive agent is added, the plating solution deteriorates in its quality. Accordingly, at present, the plating solution, after the use of a certain time period, is discarded as a whole. (consumption burden of the additive agent and plating solution).

In addition, mentioning of the seed layer, copper that is a material thereof is oxidized from a surface with the passage of time. When implementing the plating treatment on the oxidized seed layer, the formed film becomes poor in its plating quality. Accordingly, after the formation of the seed layer, time management is implemented to carry out the next step before the oxidation proceeds. (time management burden).

As explained above, there are various kinds of items forcing burdens on the manufacture in the present technology. However, in order to implement smooth and high quality liquid treatment, the above burdens are accepted as necessity.

SUMMARY OF THE INVENTION

The present invention is carried out in view of the aforementioned situations. An object of the present invention is to provide liquid treatment equipment, a liquid treatment method, a semiconductor device manufacturing method, and semiconductor device manufacturing equipment. All of these can largely reduce the frequency of discarding a treatment solution as a whole and implement smooth and high quality liquid treatment with less manufacturing burden.

Another object of the present invention is to provide a semiconductor device manufacturing method that can avoid to use an additive agent as a solution, thereby resulting in the reduction of additive agent concentration management and agitation burdens of the treatment solution, and can largely reduce the frequency of discarding the treatment solution as a whole, thereby enabling to implement smooth and high quality liquid treatment with less burden, and semiconductor device manufacturing equipment therefor.

Furthermore, still another object of the present invention is to provide a semiconductor device manufacturing method in which measures are taken to suppress the oxidation of the seed layer, thereby enabling to implement smooth and high quality liquid treatment without time management burden after the formation of the seed layer and semiconductor device manufacturing equipment therefor.

In order to overcome the above problems, liquid treatment equipment involving the present invention comprises a treatment solution bath, a treatment solution circulating system and a product removal unit. In the above, the treatment solution bath can accommodate a treatment solution for implementing liquid treatment to a substrate to treat. The treatment solution circulating system is disposed connected to the treatment solution bath and circulates the accommodated treatment solution between the outside of the treatment solution bath. The product removal unit is disposed in the treatment solution circulating system and removes a reaction product due to the liquid treatment contained in the treatment solution to be circulated.

A treatment solution accommodated in a treatment solution bath and implementing liquid treatment to a substrate to treat is circulated between the outside of the treatment solution bath. Thereby, a reaction product contained in a circulating treatment solution is removed by a product removal unit. Accordingly, chemical change matter and decomposition product remaining in the treatment solution can be removed to enable to stop deteriorating as the treatment solution. Thereby, a frequency of discarding the treatment solution as a whole can be largely reduced to result in smooth and high quality liquid treatment with less manufacturing burden to that extent.

For the chemical change matter and decomposition product as the reaction product, peeled films (black films and brown films) essentially consisting of copper oxide formed by the action of the additive agent on a surface of the anode electrode and one that floats and dissolves after the decomposition of the additive agent are contained. Furthermore, as the substrate to treat, semiconductor wafers and glass substrates (for liquid crystal display, for instance) are included. These are the same also in the following.

Liquid treatment equipment involving the present invention comprises a treatment solution bath, a treatment solution circulating system, a recycle bath and a product removal unit. In the above, the treatment solution bath can accommodate a treatment solution for implementing liquid treatment to a substrate to treat. The treatment solution circulating system is disposed connected to the treatment solution bath and circulates the accommodated treatment solution between the outside of the treatment solution bath. The recycle bath is disposed in the middle of the treatment solution circulating system, capable of reserving the treatment solution to be circulated and implements recycle treatment to the reserved treatment solution. The product removal unit is disposed in the recycle bath and removes a reaction product due to the liquid treatment contained in the reserved treatment solution.

In this case too, a reaction product contained in the circulating treatment solution is removed by a product removal unit. Thereby, chemical change matter and decomposition products remaining in the treatment solution can be removed to enable to stop deteriorating as the treatment solution. Accordingly, a frequency of discarding the treatment solution as a whole can be largely reduced to result in, to that extent, smooth and high quality liquid treatment with less manufacturing burden.

A liquid treatment method involving the present invention is one in liquid treatment equipment comprising a treatment solution bath, a treatment solution circulating system and a product removal unit. In the above, the treatment solution bath can accommodate a treatment solution for implementing liquid treatment to a substrate to treat. The treatment solution circulating system is disposed connected to the treatment solution bath and circulates the accommodated treatment solution between the outside of the treatment solution bath. The product removal unit is disposed in the treatment solution circulating system and removes a reaction product due to the liquid treatment contained in the treatment solution that is circulated. The above liquid treatment method comprises the steps of circulating the treatment solution and of removing the reaction products by means of the product removal unit. In the step of circulating the treatment solution, while or after implementing liquid treatment to the substrate to treat, by means of the treatment solution circulating system, the treatment solution is circulated. In the step of removing the reaction product, the reaction products due to the liquid treatment contained in the circulating treatment solution are removed by the use of the product removal unit.

In this case too, reaction products contained in the circulating treatment solution is removed by the product removal unit. Accordingly, chemical change matter and decomposition products remaining in the treatment solution can be removed to enable to stop deteriorating as the treatment solution. Thereby, a frequency of discarding the treatment solution as a whole can be largely reduced to result in, to that extent, smooth and high quality liquid treatment with less manufacturing burden.

Furthermore, a manufacturing method of semiconductor devices involving the present invention comprises the steps of coating a treatment agent containing a component stimulating the formation of plating and a component repressing the formation of plating on a surface of the substrate to treat and of implementing liquid treatment on the surface of the substrate to treat thereon the treatment agent is coated.

In the manufacturing method of semiconductor devices involving the present invention, a treatment agent containing a component that stimulates the formation of the plating and a component that represses the formation of the plating is, before the liquid treatment, coated on the surface of the substrate to treat. In coating on the surface of the substrate to treat, various kinds of methods can be employed. When implementing with the surface to treat held upward (face-up), the substrate is held and spun, on the upper surface thereof the treatment agent being supplied. The treatment agent is uniformly spread due to the rotation on the surface of the substrate.

When implementing with the surface to treat held downward (face-down), the substrate is held and spun, on the lower surface thereof the treatment agent is sprayed. The treatment agent is uniformly spread on the surface of the substrate due to the spinning.

Furthermore, a film can be formed due to the sol-gel method by incorporating the treatment agent containing material stimulating the formation of the plating and material repressing the formation of the plating. The obtained film can be stuck on a surface of a substrate to treat.

In the treatment agent, as a solvent, volatile matter can be used. After components dissolving in the solvent and stimulating and repressing the formation of the plating are applied on the surface of the substrate in liquid form, unnecessary solvent can be evaporated.

Furthermore, in the treatment agent, a component improving wettability may be included. Due to an improvement of the wettability, a solution can intrude with ease into fine trenches or bia holes formed on the surface of the substrate.

To the surface of the substrate to treat thereto the treatment agent is coated, the liquid treatment is applied. In the liquid treatment, a treatment solution therein no additive agent is added, an aqueous solution of copper sulfate for instance, can be used. The substrate to treat thereon the treatment agent is coated is immersed in a treatment solution bath filled with the aqueous solution of copper sulfate and, with the seed layer as the cathode, plating treatment as the liquid treatment can be implemented.

Accordingly, in the liquid treatment, the additive agent can be avoided to use as the solution. As a result, additive agent concentration management burden of the treatment solution and agitation burden thereof can be reduced, enabling to implement smooth and high quality liquid treatment with less manufacturing burden. In addition, since there is no need of considering deterioration of the additive agent of the treatment solution, the frequency of discarding the treatment solution as a whole can be largely reduced, thereby enabling to implement smooth and high quality liquid treatment with less manufacturing burden.

Furthermore, a manufacturing method of semiconductor devices involving the present invention comprises the steps of introducing a substrate to treat on the surface thereof a seed layer for the plating is formed into a treatment space and of reducing the introduced substrate to treat in the treatment space.

Due to the reduction of the seed layer, after the formation of the seed layer, there is no need of particularly implementing time management. Accordingly, smooth and high quality liquid treatment can be implemented without time management burden after the formation of the seed layer.

In the manufacturing method of semiconductor devices involving the present invention, when forming the seed layer for the plating on the surface of the substrate to treat, it is not necessary to depend on a particular method. When the seed layer for the plating can be formed, various methods can be employed. For instance, there are methods such as PVD, CVD and so on.

In the step of reducing the substrate to treat thereon the seed layer is formed, for instance, in a NOR chamber, a reducing gas (for instance, hydrogen gas) is filled to reduce the seed layer formed on the surface of the substrate to treat, or a reducing agent such as formaldehyde or the like is coated on the substrate to treat, followed by reduction.

Furthermore, a manufacturing method of semiconductor devices involving the present invention comprises the steps of introducing into a treatment space a substrate to treat on the surface thereof a seed layer for the plating is formed, of reducing the introduced substrate to treat in the treatment space, of coating a treatment agent on a surface of the substrate to treat and of implementing liquid treatment. In the step of coating a treatment agent on a surface of the substrate to treat, the treatment agent containing components stimulating and repressing the formation of the plating is coated on the reduced surface of the substrate to treat. In the step of implementing liquid treatment, on the surface of the substrate to treat thereon the treatment agent is coated the liquid treatment is implemented.

In the present manufacturing method employs both the aforementioned two methods. Accordingly, for the operation and effect thereof, the aforementioned description for these can be applied.

Furthermore, semiconductor device manufacturing equipment involving the present invention comprises a treatment agent coating unit for coating a treatment agent containing components stimulating and repressing the formation of the plating on a surface of a substrate to treat and a liquid bath for implementing liquid treatment on the surface of the substrate to treat thereon the treatment agent is coated.

The manufacturing equipment comprises a mechanical configuration for implementing the above mentioned manufacturing method. Accordingly, the operation and effects thereof are the same with the aforementioned ones. Furthermore, the treatment agent coating unit can be disposed in a treatment space different from the treatment space pertaining to the aforementioned liquid bath, or in the same treatment space with one pertaining to the liquid bath. This is the same in the following.

When disposing in the separate treatment space for instance, a device for spinning the substrate to treat to coat a resist solution due to centrifugal force or equipment for spin-cleaning and spin-drying the substrate to treat can be reconfigured into a treatment agent coating unit to use. When disposing in the same treatment space, for instance a unit for cleaning a conductor for coming into an electrical contact with the seed layer of the substrate can be reconfigured into the treatment agent coating unit to use.

Furthermore, semiconductor device manufacturing equipment involving the present invention comprises a substrate transfer unit and a reduction treatment unit. In the above, the substrate transfer unit introduces a substrate to treat on a surface thereof the seed layer for plating is formed into a treatment space. The reduction unit reduces the introduced substrate in the treatment space.

The manufacturing equipment also comprises a mechanical configuration for implementing the aforementioned manufacturing method. Accordingly, the operation and effects thereof are the same with the aforementioned ones.

Furthermore, semiconductor device manufacturing equipment involving the present invention comprises a substrate transfer unit, a reduction treatment unit, a treatment agent coating unit and a liquid bath. In the above, the substrate transfer unit introduces into the treatment space a substrate to treat on a surface thereof a seed layer for plating is formed. The reduction treatment unit reduces the introduced substrate in the treatment space. The treatment agent coating unit is disposed in a treatment space different from the aforementioned treatment space and coats a treatment agent containing components stimulating and repressing the formation of the plating on the surface of the reduced substrate. The liquid bath implements the liquid treatment onto the surface of the substrate thereon the treatment agent is coated.

The manufacturing equipment also comprises a mechanical configuration for implementing the aforementioned manufacturing method. Accordingly, the operation and effects thereof are the same with the aforementioned ones.

BRIEF DESCRIPTION OF THE DRAWINGS

FIG. 1 is also a perspective view of a system including a plating unit that is a seventh embodiment of the present invention.

FIG. 5 is a vertical section showing schematically a configuration of a treatment agent coating unit used as a fifth embodiment of the present invention.

DESCRIPTION OF PREFERRED EMBODIMENTS

As a preferable embodiment of the present invention, the liquid treatment equipment further comprises an additive agent supply unit. The additive agent supply unit is disposed connected to the treatment solution circulating system and supplies additive agent of organic components and/or sulfur component in the circulated treatment solution.

Furthermore, as a preferable embodiment of the present invention, the liquid treatment equipment further comprises an additive agent concentration measuring unit. The additive agent concentration measuring unit is disposed connected to the treatment solution circulating system and measures concentration of additive agent of organic components and/or of sulfur component in the circulated treatment solution.

Furthermore, as a preferable embodiment of the present invention, the liquid treatment equipment further comprises a volume/weight measuring unit. The volume/weight measuring unit is disposed in the treatment solution circulating system and measures a volume or weight of the circulated treatment solution.

Furthermore, as a preferable embodiment of the present invention, the liquid treatment equipment comprises a product removal unit, wherein the product removal unit removes the reaction products by electrically absorbing them.

Furthermore, as a preferable embodiment of the present invention, in the liquid treatment equipment, the product removal unit includes a heating unit for heating the circulated treatment solution.

Still furthermore, as a preferable embodiment of the present invention, the liquid treatment equipment further comprises a reservoir tank. In the above, the reservoir tank is disposed in the treatment solution circulating system on the way from the treatment solution bath to the recycle bath to reserve temporarily the treatment solution to be circulated.

Furthermore, as a preferable embodiment of the present invention, the liquid treatment equipment further comprises a buffer bath. In the above, the buffer bath is disposed in the treatment solution circulating system on the way from the recycle bath to the treatment solution bath to reserve temporarily the treatment solution to be circulated.

(First Embodiment)

In the following, liquid treatment equipment that is a first embodiment of the present invention will be explained. The liquid treatment equipment involving the present embodiment is constituted of a plating unit as part of a systemized plating equipment and a plating solution regeneration unit for readjusting the plating solution that is repeatedly used in the plating treatment unit and deteriorated in the plating capacity.

Figure 1:
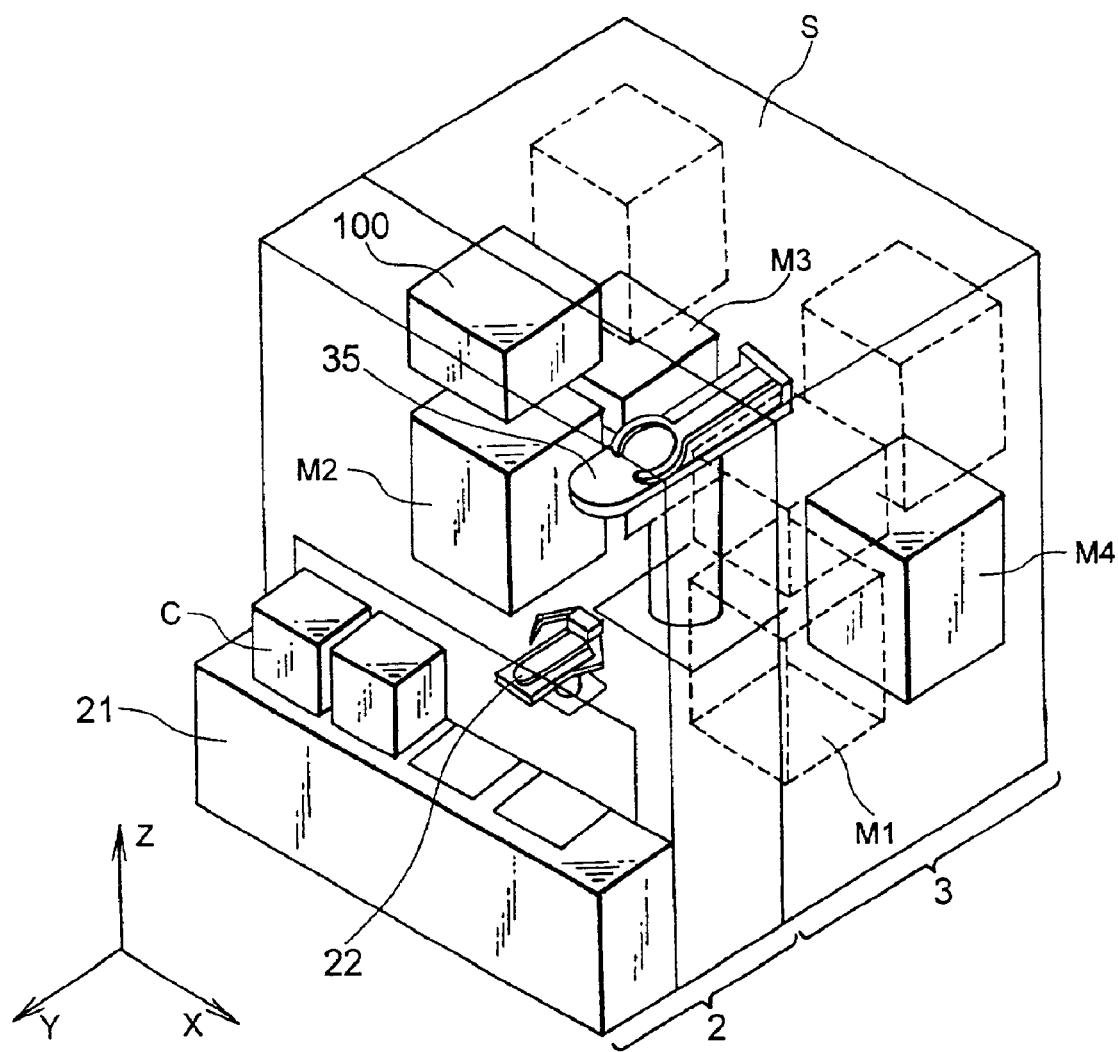
FIG. 1 is a perspective view of a system including a plating unit. The plating unit is a partial configuration of liquid treatment equipment that is a first embodiment of the present invention. In addition.

First, the systemized plating equipment will be explained with reference to FIGS. 1 through 4. FIG. 1 is a perspective view of the systemized plating equipment, FIG. 2 being a plan view of the same plating equipment, FIG. 3 being a front view of the same plating equipment, FIG. 4 being a side view of the same plating equipment.

As shown in FIGS. 1 through 4, this plating equipment 1 is constituted of a carrier station 2 for carrying in or out or transferring a wafer W and a process station 3 for implementing actual steps of treatment to the wafer W.

The carrier station 2 is constituted of a susceptor 21 for accommodating the wafer W and a sub-arm 22 that makes an access to a carrier cassette C disposed on the susceptor 21 and takes out the wafer W accommodated therein or accommodate a wafer W of which treatment is over.

In the carrier cassette C, a plurality of sheets, for instance 25 sheets, of wafers W are accommodated held level with an equidistance apart in a vertical direction. On the susceptor 21, in the X direction in the figure, for instance 4 sets of carrier cassettes C are disposed.

Figure 2:
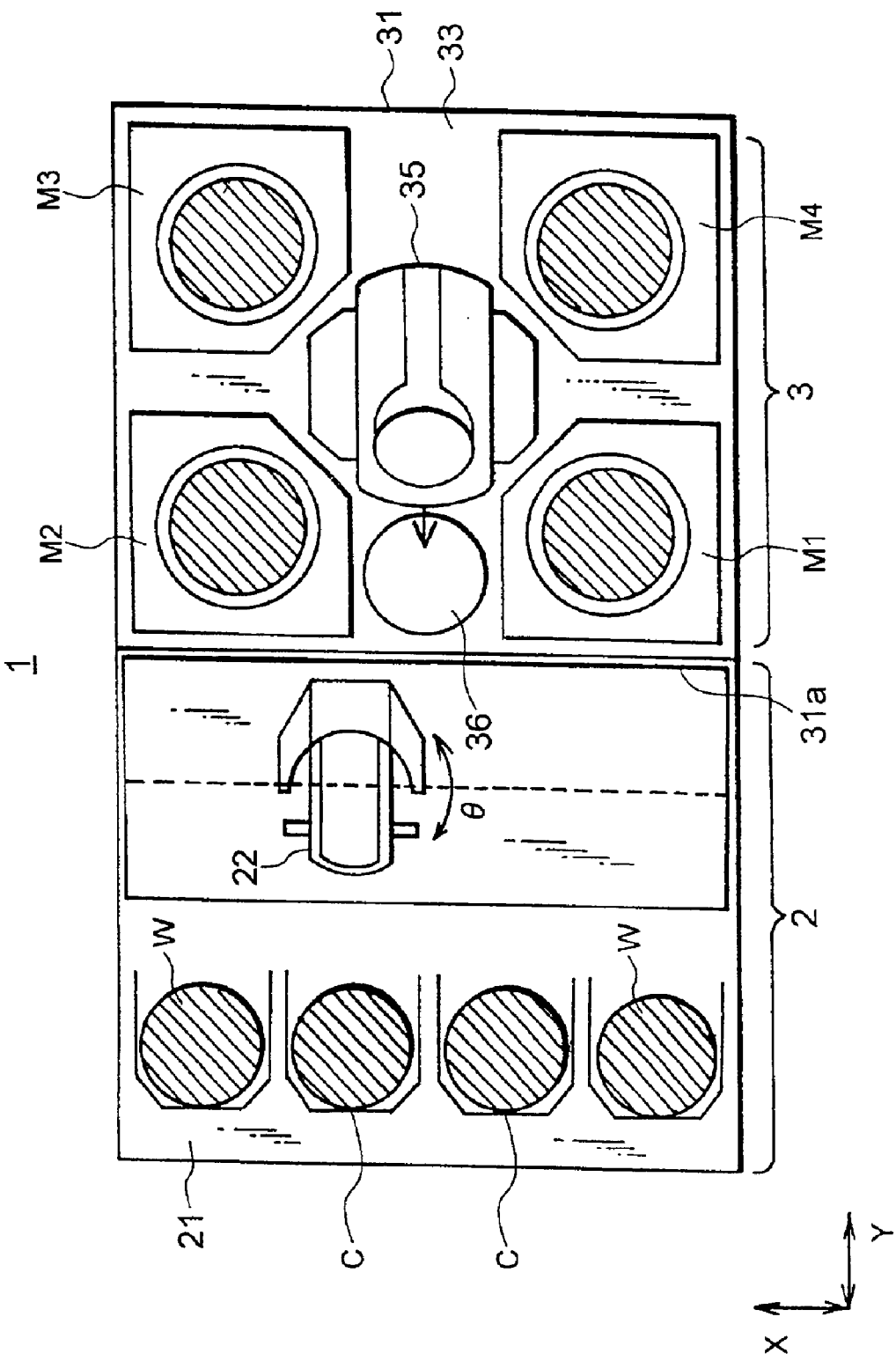
FIG. 2 is a plan view of a system shown in FIG. 1.

The sub-arm 22 is provided with a structure that, in addition to moving on a rail disposed in the X direction in FIG. 2, is capable of elevating in a vertical direction (Z direction), that is in a direction vertical to a paper surface, and of rotating in a horizontal plane. Thereby, the sub-arm 22 takes out, from the carrier cassette C disposed on the susceptor 21, a untreated wafer W in the carrier cassette C, or accommodates a treated wafer W in the carrier cassette C.

Furthermore, the sub-arm 22 delivers wafers W before and after the treatment between the process station 3 described later.

The process station 3 has, as shown in FIGS. 1 through 4, an appearance of a box of a rectangular parallelepiped or a cube, an entire surrounding thereof being covered by a housing 31 made of corrosion-resistant material such as resin or a metal plate whose surface is coated by resin for instance.

Figure 4:
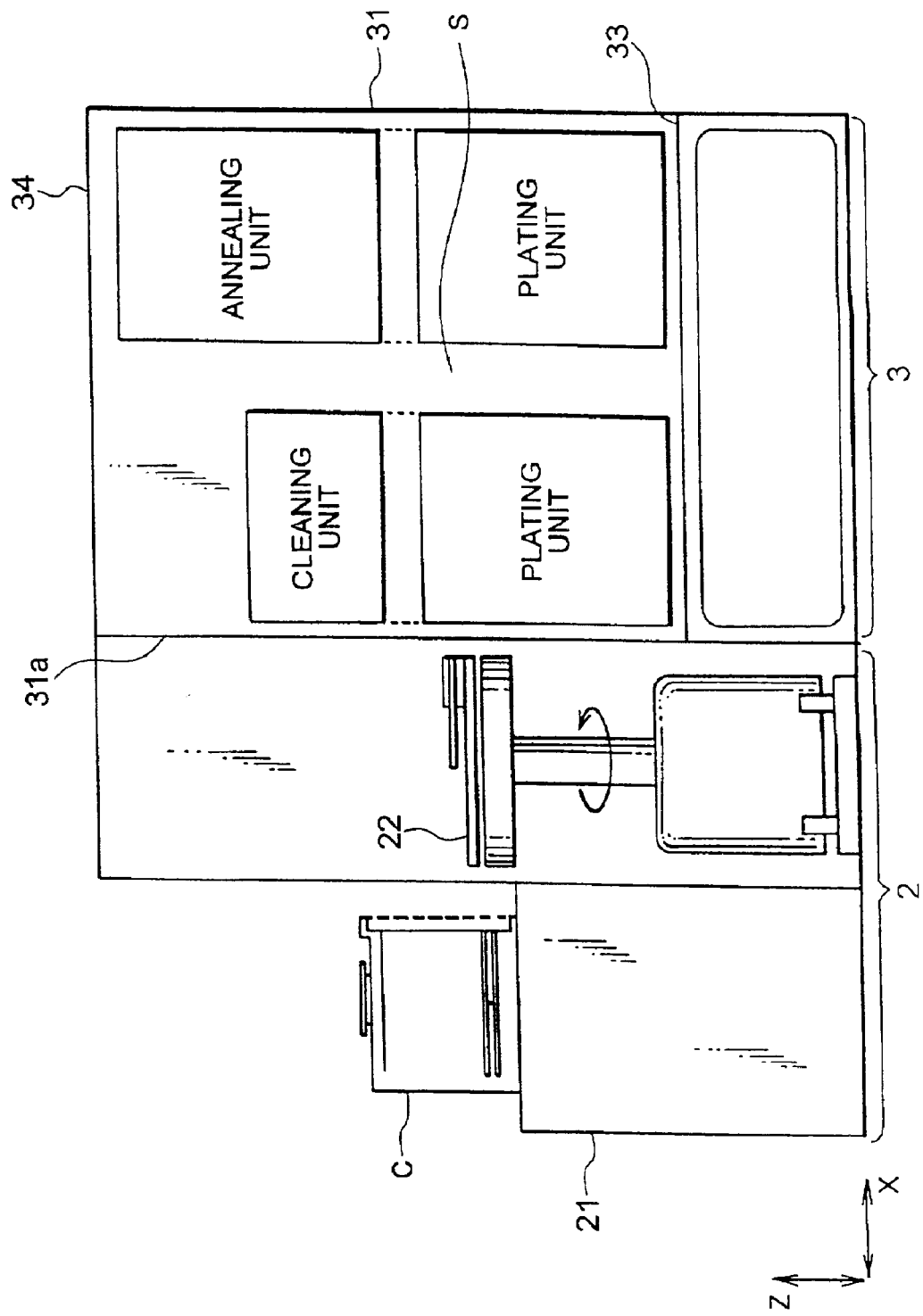
FIG. 4 is a side view of a system shown in FIG. 1.

The inside of the process station 3 is, as shown in FIGS. 1 and 4, configured into a box of an approximate cube or rectangular parallelepiped, inside thereof a treatment space S being formed.

The treatment space S is, as shown in FIGS. 1 and 4, a rectangular parallelepiped treatment chamber, at the base of the treatment space S a bottom plate 33 being disposed.

In the treatment space S, a plurality of treatment units, for instance four plating units M1 through M4, are disposed in the surroundings of a main-arm 35 described below in the treatment space S for instance, respectively.

As shown in FIGS. 1 and 2, at an approximate center of the bottom plate 33, a main-arm 35 is disposed to transfer the wafer W. The main-arm 35 is capable of elevating and rotating in a horizontal plane, and is further provided above and below with two wafer holding members extensible in an approximately horizontal plane. By extending the wafer holding members, to the treatment units disposed in the surroundings of the main-arm 35, the wafers W before and after the treatment can be carried in or out. Furthermore, the main-arm 35 is configured to be capable of moving in a vertical direction to be accessible to an upper side treatment unit. Thereby, a wafer W can be transferred from the treatment unit on the lower side to the treatment unit on the upper side or, on the contrary, from the treatment unit on the upper side to the treatment unit on the lower side.

Furthermore, the main-arm 35 is equipped with a mechanism capable of reversing a held wafer W in an up and down direction. In the course of transferring the wafer W from one treatment unit to the other treatment unit, the wafer W can be reversed in an up and down direction. The function for reversing the wafer W is not a necessary function to the main-arm 35.

On the upper side, other treatment unit, for instance two sets of cleaning units 100 for instance are disposed on the side close to the carrier station, that is on the upper side of the aforementioned plating units M1, M2, respectively. In addition, for instance two sets of for instance annealing units are disposed on the remote side from the carrier station, that is on the upper side of the plating units M3, M4, respectively. In the plating equipment, other treatment units are disposed on the plating units M1 through M4, a footprint being suppressed small. On the upper stage of the plating units M1 through M4, other treatment unit than the cleaning or annealing unit may be appropriately disposed.

Figure 3:
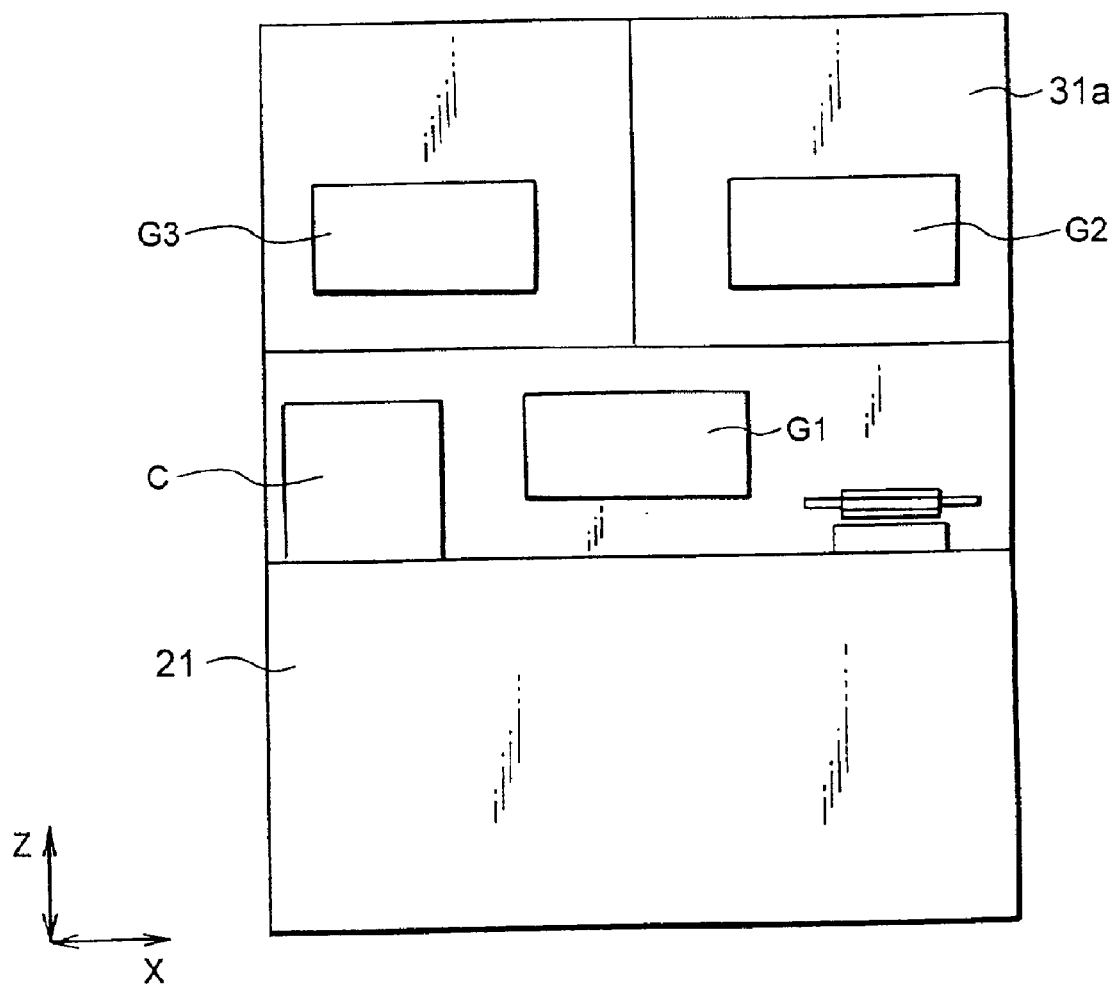
FIG. 3 is a front view of a system shown in FIG. 1.

Of the housing 31 of the process station 3, in a housing 31a disposed at a position facing the carrier station 2, as shown in FIG. 3, there are disposed three openings G1 through G3 capable of opening. Of these, the G1 is an opening corresponding to a position of a middle susceptor 36 disposed between the plating units M1 and M2 disposed on the lower side. The G1 is used when an untreated wafer W taken out of the carrier cassette C by the sub-arm 22 is carried in the process station 3. When carrying in, the opening G1 is opened and the sub-arm 22 holding the untreated wafer W extends the wafer holding member into the treatment space S to dispose the wafer W on the middle susceptor 36. To the middle susceptor 36, the main-arm 35 extends the wafer holding member to hold the wafer W disposed on the middle susceptor 36 to transfer into the treatment unit such as the plating units M1 through M4.

The remaining openings G2 and G3 are disposed at a position corresponding to the cleaning unit 100 disposed on a side close to the carrier station 2 in the treatment space S. Through these openings G2 and G3, the sub-arm 22 directly extends the wafer holding member up to the cleaning unit 100 disposed on the upper side in the treatment space S to receive the treated wafer W.

In addition, in the treatment space S, an air flow directing from above to below in FIG. 4 is formed, thereby a clean air supplied from the outside of the system is fed from the upper portion of the treatment space, flowing down toward the cleaning unit 100 and the plating units M1 through M4, being finally exhausted from the bottom of the treatment space S outside of the system.

By flowing thus the clean air downward from the above in the treatment space S, the air is prevented from flowing from the plating units M1 through M4 on the lower stage toward the cleaning unit 100 on the upper stage. Accordingly, the cleaning unit side is always kept in a clean atmosphere.

Furthermore, the insides of the respective treatment units such as the plating units M1 through M4, the cleaning unit 100 or the like are maintained at lower pressure than that of the treatment space S of the system. Accordingly, the air flows from the treatment space S side toward the insides of the respective treatment units, followed by exhausting from the respective treatment units outside of the system. As a result, dirt is prevented from diffusing from the treatment unit side to the treatment space S side.

Figure 5:
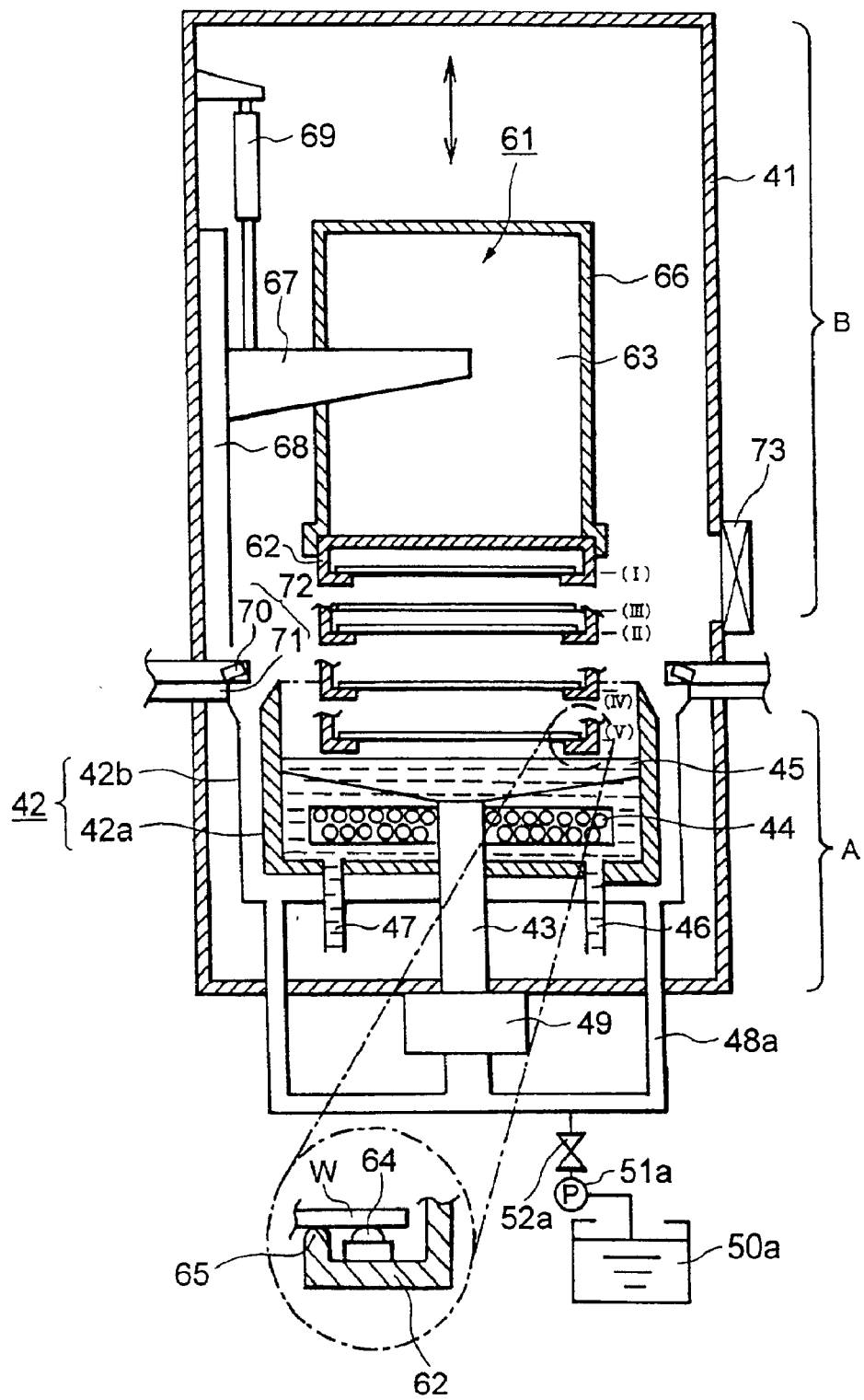
FIG. 5 is a schematic vertical section of a plating unit that is a partial configuration of liquid treatment equipment that is a first embodiment of the present invention. In addition.

Next, with reference to FIGS. 5 and 6, the plating unit included in the above plating equipment will be explained. FIG. 5 is a schematic vertical section including a partially enlarged drawing of the plating unit M1 (or M2, M3 and M4) shown in FIGS. 1 through 4, FIG. 6 being a schematic plan view of the plating unit M1.

Figure 6:
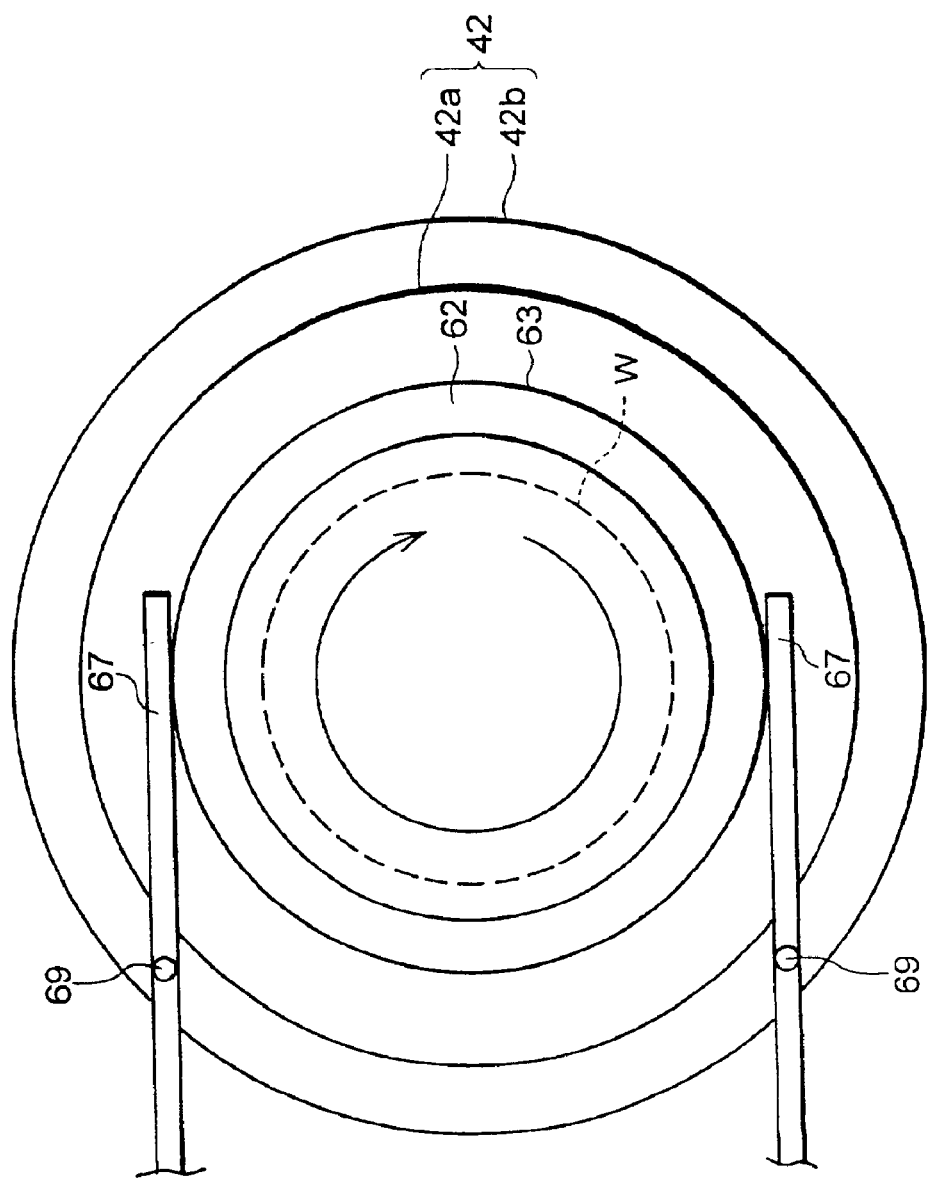
FIG. 6 is a schematic plan view of a plating unit that is a partial configuration of liquid treatment equipment that is a first embodiment of the present invention.

As shown in FIGS. 5 and 6, an entirety of the plating unit M1 is covered by a housing 41 of airtight structure. The housing 41 also is constituted of corrosion resistant material such as resin or the like.

The inside of the housing 41 is divided into two of upper and lower stages, that is, a first treatment unit A positioned on a lower stage and a second treatment unit B positioned on a higher stage.

The inside of the first treatment unit A is provided with a plating solution bath 42. The plating solution bath 42 is constituted of a double bath of an inner bath 42a and an outer bath 42b disposed outside the inner bath 42a concentrically with the inner bath 42a.

The inner bath 42a is formed into an approximate cylinder shape with a bottom and inside thereof 42a, a source tube 43 projects to flow the plating solution from the bottom side of the inner bath 42a toward the upper surface. In the surroundings of the source tube 43, a plurality of copper balls are gathered in an approximate disc shape to form an electrode 44 as the anode disposed concentrically with the inner bath 42*a*. Between an end periphery of the source tube 43 and the inner bath 42*a*, a membrane 45 separating the inner bath 42*a* into the above and below is disposed above the electrode 44. Into the upper side of the inner bath 42*a* (hereafter, refers to as the upper side of the inner bath) separated by the membrane 45, from the source tube 43, the plating solution is supplied. Into the lower side of the inner bath 42*a* (hereafter, refers to as the lower side of the inner bath) separated by the membrane 45, from circulation piping described below, the plating solution is supplied. The membrane 45, though allowing ions to go through, prevents impurity generated when the copper balls as the electrode 44 are dissolved and bubbles such as oxygen and hydrogen for instance generated in the course of the plating from going through. Furthermore, at positions eccentric from a center of the bottom surface of the inner bath 42*a*, the circulation piping 46 and 47 is disposed, therebetween 46 and 47, a pump not shown in the figure being disposed.

The outer bath 42*b* is formed into an approximate cylinder shape with a bottom similarly with the inner bath 42*a*, to the bottom of the outer bath 42*b* piping 48*a* being connected. Between the piping 48*a* and the source tube 43, a pump 49 is disposed. By operating the pump 49, the plating solution that overflowed from the inner bath 42*a* and is reserved in the outer bath 42*b* is again supplied to the upper side of the inner bath 42*a*.

Furthermore, to the piping 48*a*, a reservoir tank 50*a* that accommodates the plating solution and is disposed inside of a plating solution regeneration unit described below is connected through a pump 51*a* and a bulb 52*a*.

In the second treatment unit B, a driver 61 as a mechanism for holding a wafer W is disposed immediately above a center of the plating solution bath 42. In addition, the driver 61 is constituted of a holder 62 holding the wafer W and a motor 63 rotating the wafer W together with the holder 62 in an approximate level plane.

As shown in a partially enlarged drawing in FIG. 5, on the inside surface of the bottom of the holder 62, at 128 positions divided equally for instance, convex contacts 64 are disposed to input a voltage to the wafer W. The convex contact 64 is in electrical contact through a leading wire with a power source not shown in the figure. On the convex contact 64, a wafer W on whose surface to plate a copper thin film is previously formed due to the sputtering is mounted. Accordingly, the voltage applied to the convex contact 64 is also applied to the surface to plate of the wafer W. Furthermore, on the inside surface of the bottom of the holder 62 a sealing member 65 is disposed.

The motor 63 is covered by a cover 66 formed of corrosion resistant material such as resin or the like. Furthermore, to an outside vessel of the motor 63 a support beam 67 is attached to support the driver 61, one end of the support beam 67 being attached to an inner wall of the housing 41 movable up and down through a guide rail 68. The support beam 67 is further attached to the housing 41 through a cylinder 69 expandable up and down, by driving the cylinder 69 the driver 61 supported by the support beam 67 being moved up and down along the guide rail 68 to elevate the wafer W.

Specifically, as shown in FIG. 5, the wafer W disposed on the holder 62 of the driver 61 goes up and down mainly between the following five positions of different heights along a center axis of the plating solution bath 42. The above five positions include a transfer position (I) for transferring, a cleaning position (II) for cleaning the surface to plate of the wafer W, a position (III) a little higher than that (II) for cleaning the convex contact 64, a spin dry position (IV) for spin-drying to remove excess plating solution or water, and a plating position (V) for forming a plating layer on a surface to plate of the wafer W.

Between the first and second treatment units A and B, there is disposed a separator 72 that incorporates a cleaning nozzle 70 and an exhaust opening 71 disposed on the lower side thereof 70. In the center of the separator 72, a through-hole is disposed so that the wafer W held by the driver 61 can come and go between the first and second treatment units A and B. In addition, to the housing of the portion corresponding to a boundary between the first and second treatment units A and B, a gate valve 73 is disposed to transfer the wafer W in and out of the plating unit M1.

The steps in the plating equipment 1 to form the plating layer on a surface to plate of the wafer W and steps of the plating implemented in the plating unit M1 will be roughly explained.

Figure 7:
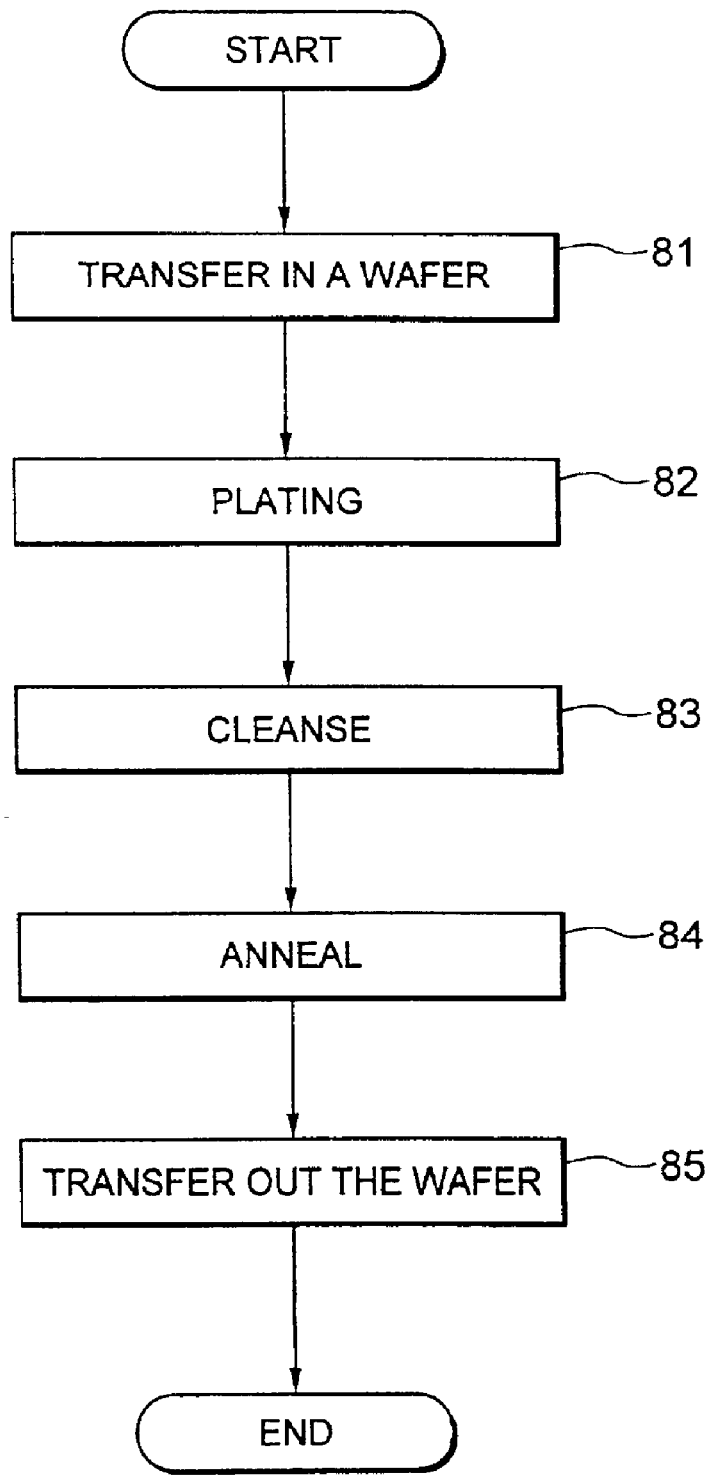
FIG. 7 is a flow chart showing a flow of steps of the system shown in FIG. 1.
Figure 8:
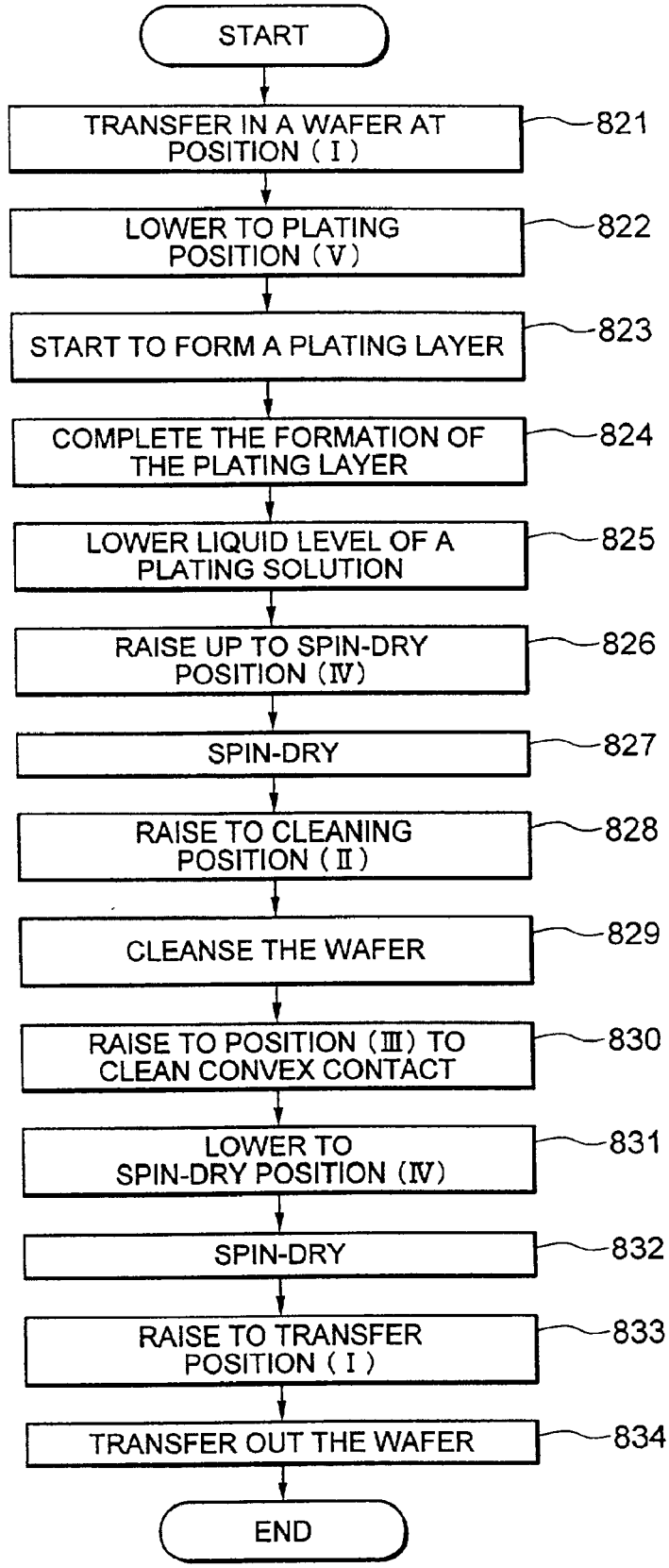
FIG. 8 is a flow chart showing a flow of steps of the plating unit shown in FIG. 5.

FIG. 7 is a flow chart showing the entire steps of the plating equipment 1, FIG. 8 being a flow chart showing the plating steps carried out at the plating unit M1 (or M2, M3, M4).

As the steps of the plating equipment 1, first, as shown in FIG. 7, the wafer W is transferred into the treatment space S (step 81).

Next, at the plating unit M1 (or M2, M3, M4), on the surface to plate of the wafer W, the plating layer is formed (step 82).

The wafer W, after the formation of the plating layer on the surface to plate, is cleaned (step 83) and annealed (step 84), being carried out of the treatment space S (step 85).

The step 82 in FIG. 7 (plating in the plating unit M1) is detailed in FIG. 8.

That is, at the transfer position (I) the wafer W is carried in (step 821) and lowered (step 822) to the plating position (V). At this time, the inside of the plating solution bath 42 is filled by the plating solution. In this state, the plating layer starts to form on the surface to plate of the wafer W (step 823), and the formation of the plating layer comes to completion after the passage of a prescribed time period (step 824).

Next, the liquid level of the plating solution is lowered (step 825), and the wafer W is raised up to the spin-dry position (IV) (step 826). Then, the plating solution remaining on the surface to plate of the wafer W is spin-dried (step 827).

Next, the wafer W is raised up to the cleaning position (II) (step 828) and the plating surface of the wafer W is cleansed by spraying for instance pure water from the cleaning nozzle 70 (step 829). In addition, the wafer W only is raised to the position (III) to cleanse the convex contact 64 (step 830).

Next, the wafer W is lowered to the spin-dry position (IV) (step 831) to spin-dry (step 832), thereby removing the cleaning fluid remaining on the plating surface. After the removal of the cleaning fluid, the wafer W is raised to the transfer position (I) (step 833), followed by carrying out of the wafer W (step 834).

Figure 9:
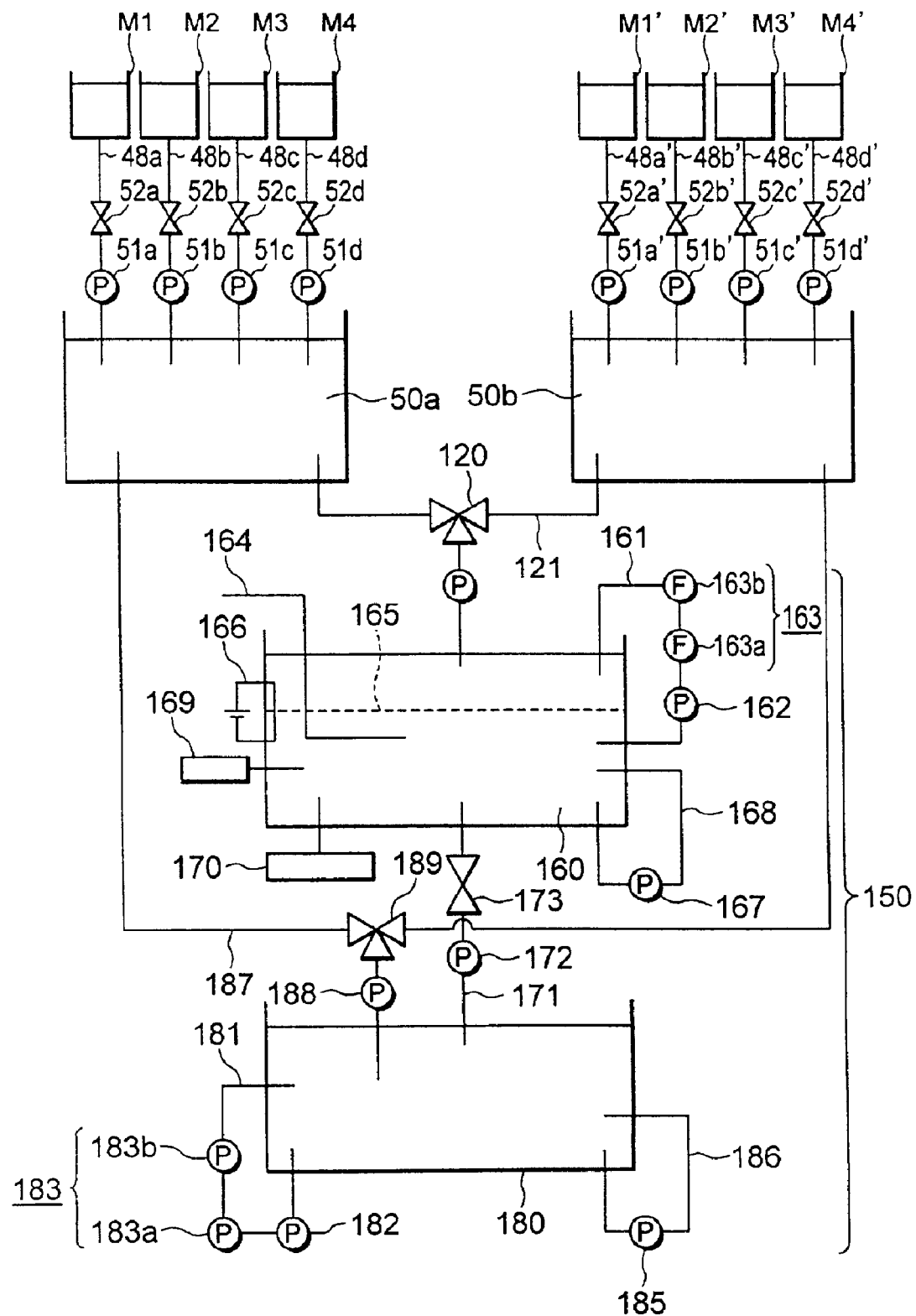
FIG. 9 is a schematic system diagram showing a configuration of liquid treatment equipment that is a first embodiment of the present invention.

Next, the plating solution regeneration unit that is a remaining portion of the liquid treatment equipment that is the first embodiment of the present invention will be explained with reference to FIG. 9. FIG. 9 is a schematic system diagram showing a configuration of the liquid treatment equipment that is the first embodiment of the present invention. The plating solution regeneration unit, as mentioned above, regenerates the plating solution of which plating capacity has deteriorated due to the repeated use in the plating units M1 through M4.

As shown in FIG. 9, through the pumps 51a through 51d and the valves 52a through 52d, there is connected to the piping 48a through 48d of the plating units M1 through M4, as mentioned above, a reservoir tank 50a for reserving the plating solution that is supplied to or exhausted from the plating units M1 through M4. By controlling these pumps 51a through 51d and the valves 52a through 52d respectively, the plating solution can be freely supplied from the reservoir tank 50a to the plating units M1 through M4 or exhausted from the plating units M1 through M4.

Similarly, to piping 48a' through 48d' of plating units M1' through M4' disposed in a separate plating equipment, a reservoir tank 50b is connected through pumps 51a' through 51d' and valves 52a' through 52d'. By controlling these pumps 51a' through 51d' and the valves 52a' through 52d' respectively, the plating solution can be freely supplied from the reservoir tank 50b to the plating units M1' through M4' or exhausted from the plating units M1' through M4'.

In the reservoir tanks 50a and 50b, when the concentration of the additive agent in the plating solution becomes a prescribed value, due to a controlling means not shown in the figure, the plating solution can be supplied in a recycle bath described below. To this end, to the reservoir tanks 50a and 50b, a concentration measuring device for instance such as CVS that is not shown in the figure is disposed respectively to measure the concentration of the additive agent contained in the respective plating solutions.

Furthermore, to the reservoir tanks 50a and 50b, piping 121 equipped with a switching valve 120 is connected, and furthermore the piping 121 being connected to a plating solution preparation unit 150 described below. By operating the switching valve 120 of the piping 121, the following can be implemented. That is, a plating solution containing decomposed additive agent exhausted from for instance the plating units M1 through M4 and reserved in the reservoir tank 50a (hereafter refers to as "used plating solution") can be freely transferred to the plating solution preparation unit 150. Similarly, the used plating solution exhausted from the plating units M1' through M4' of another plating equipment and reserved in the reservoir tank 50b can be freely transferred to the plating solution preparation unit 150.

The plating solution preparation unit 150 is configured of a recycle bath 160 and a buffer bath 180. Here, the recycle bath 160 removes impurities such as the additive agent, decomposition products of the additive agent and particles from the used plating solution and adds, to the plating solution after the removal thereof, deficient components (including the additive agent). The buffer bath 180 reserves the plating solution there to the deficient components are added to readjust to the prescribed composition.

To the recycle bath 160, the piping 121 is connected, therein the used plating solution transferred from the reservoir tanks 50a and 50b being reserved.

Furthermore, to the recycle bath 160, piping 161 of which both ends are connected to the recycle bath 160 is disposed. The piping 161 transfers the used plating solution to a filter 163 described below, the plating solution filtered by the filter 163 being again returned to the recycle bath 160 to form a circulating system.

The piping 161 is provided with a pump 162 and for instance the filter 163 as filtering member. By the action of the pump 162, the used plating solution is filtered by the filter 163. Thereby, the additive agent, decomposition products of the additive agent and particles contained in the used plating solution are removed. The additive agent, in general when for instance a copper plating layer is formed on the wafer, is constituted of an agent for stimulating grain growth thereof and a agent for repressing the grain growth thereof. The stimulating agent is mainly organic components and the repressing agent is mainly sulfur components. Of the removable substances by the use of the filter 163, one involving the additive agent is mainly organic components, specifically being compounds large in a diameter such as high polymer compounds.

In the present embodiment, there are disposed two of the above filters 163 at two positions of the piping 161, these being different in coarseness. Specifically, the filter is configured in two stages such that for a first filter 163a, a filter of coarseness of for instance 0.1 μm or more is used and for a second filter 163b, a filter of coarseness of for instance less than 0.1 μm is used. More specifically, the first filter 163a can be set at the coarseness of 0.1 μm and the second filter 163b at the coarseness of 0.05 μm.

That is, by means of the first filter 163a, the compounds of which coarseness is 0.1 μm or more and that occupy almost all of the larger diameter, is removed, and by means of the second filter 163b of the coarseness of 0.5 μm, compounds passed the first filter 163a can be assuredly removed.

Furthermore, to the recycle bath 160, as heating member for heating the used plating solution, for instance a heater 164 is disposed. The used plating solution in the recycle bath 160 is heated by the heater 164 to remove the additive agent, the decomposition products of the additive agent and particles. One involving the additive agent of the removable substances by the heating is mainly organic components. Specifically, these are low molecular weight compounds small in diameter and low in boiling point that can not be removed by means of the first and second filters 163a and 163b such as for instance acetone.

Heating temperature of the heater 164 is one that can vaporize the low molecular weight compounds of low boiling point to separate the low molecular weight compounds from an aqueous solution of copper sulfate, specifically from 40 to 60° C. for instance, more preferably approximately 50° C. The reason why the heating temperature of the heater 164 is selected in the above range is as follows. That is, when exceeding the above range, since the temperature approaches the boiling point of water, for instance even water in the aqueous solution of copper sulfate as the main component of the plating solution tends to vaporize. Contrary to the above, when falling short of the above range, the low molecular weight compounds of low boiling point such as acetone or the like, not approaching the boiling point, cannot be separated from the aqueous solution of copper sulfate due to the difference of the boiling points.

Furthermore, in the recycle bath 160, for instance a mesh filter 165 as a metallic absorbing member is disposed in an approximately level plane, thereto 165 a power source 166 being connected. Due to the electricity supplied from the power source 166, an electric current flows to the mesh filter 165. By flowing a current to the mesh filter 165, the additive agent, decomposition products of the additive agent and particles are absorbed by the mesh filter 165 and removed. Here, of the removable substances by flowing a current to the mesh filter 165, one involving the additive agent is mainly sulfur components.

Furthermore, to the recycle bath 160, piping 168 provided with a pump 167 of which both ends are connected to the recycle bath 160 is connected. By the action of the pump 167, the plating solution is circulated in the recycle bath 160 to agitate.

In addition, to the recycle bath 160, a volume or weight measuring device not shown in the figure such as for instance a liquid level sensor is disposed. Thereby, a volume or weight of the plating solution therefrom the impurities such as the additive agent, the decomposition products of the additive agent and particles are removed by the use of the aforementioned filter 163, heater 164 and mesh filter 165 is measured.

Furthermore, to the recycle bath 160, a concentration measuring device 169 such as for instance CVS for measuring the concentrations of the respective components of the plating solution is disposed. By means of the concentration measuring device 169, the concentrations of the respective components of the plating solution therefrom the impurities such as additive agent, decomposition products of the additive agent and particles are removed are measured.

Still furthermore, to the recycle bath 160, a supplier 170 is disposed. The supplier 170 supplies, based on the measurements of the aforementioned volume or weight measuring device and concentration measuring device 169, by a not shown controlling means, the respective components (including the additive agent) of the plating solution. The supplier 170 may be structured to supply to the buffer bath described below.

The supplier 170, in addition to the supply of the respective deficient components of the plating solution (additive agent other than water, sulfuric acid, and copper sulfate), by controlling an amount of supply, can return the concentrations of the respective components contained in the used plating solution to that of the unused one.

Furthermore, to the recycle bath 160, piping 171 of which one end is connected to the recycle bath 160 and other end is connected to the buffer bath 180 is disposed. The piping 171 is equipped with a pump 172 and a valve 173. By operating the pump 172 and simultaneously opening the valve 173, the plating solution of which respective components are readjusted by means of the recycle bath 160 is transferred to the buffer bath 180.

To the buffer bath 180, piping 181 of which both ends are connected thereto 180 is disposed. The piping 181 sends the plating solution readjusted to the prescribed composition from the buffer bath 180 to the filter 183 described below and returns the plating solution filtered by the filter 183 once more to the buffer bath 180.

To the piping 181, a pump 182 and a filter 183 are disposed. By the action of the pump 182, the plating solution readjusted to the prescribed composition goes through the filter 183. Thereby, the impurities such as the decomposition products and particles that cannot be removed by the recycle bath 160 can be removed.

The aforementioned filter 183 is disposed at two positions of the piping 181 in two stages. Specifically, for instance, for a third filter 183a a filter of a coarseness of 1 $\mu$m or more is used, for a fourth filter 183b a filter of a coarseness of 0.1 $\mu$m or more being used.

Furthermore, to the buffer bath 180, piping 186 equipped with a pump 185 of which both ends are connected to the buffer bath 180 is connected. By the action of the pump 185, the plating solution that is readjusted to the prescribed composition is circulated in the buffer bath 180 to agitate.

Still furthermore, to the buffer bath 180, piping 187 of which one end is connected to the buffer bath, 180 and the other end is connected to the reservoir tanks 50a and 50b is disposed. The piping 187 is provided with a pump 188 and a switching valve 189. By moving the pump 188 and switching the switching valve 189, the plating solution readjusted to the prescribed composition can be freely supplied from the buffer bath 180 to the reservoir tank 50a or 50b.

Figure 10:
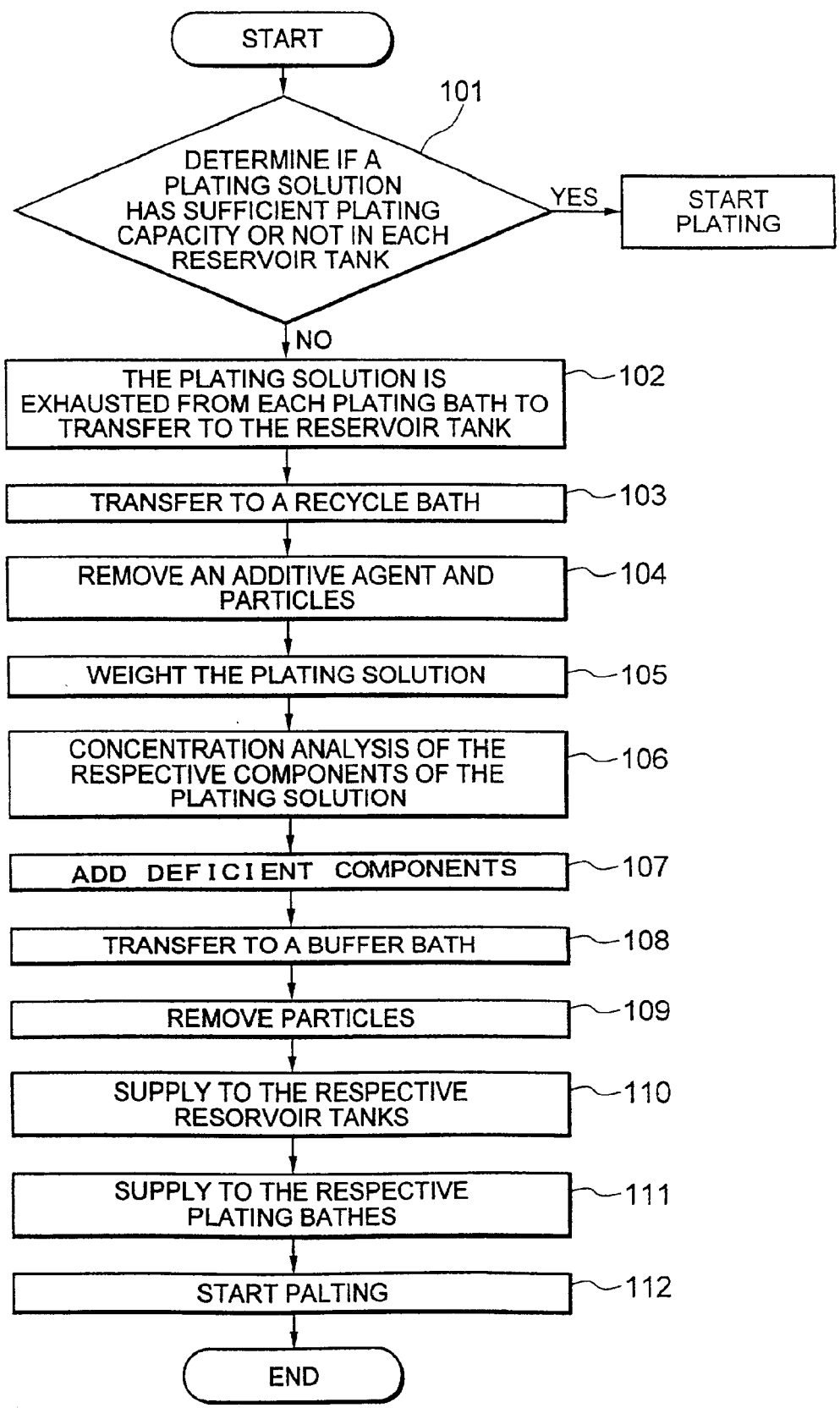
FIG. 10 is a flowchart showing a flow of steps of treatment solution regeneration of the liquid treatment equipment that is a first embodiment of the present invention.

A flow of steps of the aforementioned plating solution regeneration unit will be explained with reference to FIG. 10. FIG. 10 is a flow chart showing the steps of plating solution regeneration implemented in the plating solution regeneration unit involving the present embodiment.

First, by means of a concentration measuring device not shown in the figure such as for instance CVS disposed to the reservoir tanks 50a and 50b, the concentration of the additive agent contained in the plating solution of each reservoir tank is measured to determine whether the additive agent has plating capacity or not (step 101).

When the additive agents of the respective reservoir tanks 50a and 50b are determined to be yet capable of plating, the plating is subsequently carried out.

When the additive agents of the respective reservoir tanks 50a and 50b are determined to be incapable of plating, by operating the pump 51a for instance and releasing the valve 52a, the used plating solution is sent from the plating unit M1 through the piping 48a to the reservoir tank 50a (step 102).

Furthermore, thereafter by operating the switching valve 120 in the piping 121 connected to the reservoir tank 50a, the used plating solution reserved in the reservoir tank 50a is transferred to the recycle bath 160 (step 103). In the recycle bath 160, the pump 167 of the piping 168 connected thereto is operated to circulate the plating solution inside of the recycle bath 160.

The used plating solution, in the recycle bath 160, by the action of the pump 162 in the piping 161 connected to the recycle bath, is effected to go through the first and second filters 163a and 163b to be filtered. By filtering with the first and second filters 163a and 163b, the additive agent contained in the used plating solution, the compounds of larger diameter such as polymer compounds of mainly organic components, can be removed and the particles of relatively large in diameter also can be removed.

Furthermore, the used plating solution in the recycle bath 160 is heated by means of the heater 164. Thereby, organic low molecular weight compounds of small diameter and low boiling point, the decomposition products of the additive agent and the particles contained in the used plating solution are vaporized. Due to the use of the difference of the boiling points of the plating solution and the additive agent, from the used plating solution, mainly the low molecular weight compounds can be assuredly removed.

Still furthermore, by applying the electricity supplied from the power source 166 to the metallic mesh 165, a current is flowed to the mesh filter 165. Thereby, the additive agent, mainly sulfur component, contained in the used plating solution is absorbed by the mesh filter 165. Since the additive agent is absorbed by the mesh filter 165 thereto the electricity is applied, the component suitable for absorption, mainly sulfur component, can be assuredly removed from the used plating solution (the above is step 104).

After the impurities such as the additive agent, the decomposition products of the additive agent and the particles are removed from the used plating solution, by the use of for instance the weight measuring device not shown in the figure, the weight of the used plating solution is measured (step 105).

The plating solution therefrom the impurities are removed, after the measurement of the weight thereof, is measured of the concentrations of the respective components of the plating solution by means of the concentration measuring device 169 such as for instance CVS disposed to the recycle bath 160 (step 106).

After the measurements of the concentrations of the respective components of the plating solution therefrom the impurities are removed, based on the measurements due to the above weight measuring device and concentration measuring device 169, the supplier 170 adds the respective deficient components of the plating solution thereto to readjust to the prescribed composition (step 107). Thus, after the removal of the additive agent, the particles and so on from the used plating solution, the additive agent is added anew to the plating solution to readjust the plating solution to the prescribed composition. As a result, the frequency of replacement of the plating solution can be largely reduced. Accordingly, an amount of waste liquid can be reduced and the accompanying cost can be reduced.

Furthermore, even when there are disposed a plurality of plating units in the plating equipment as in the present embodiment, or even when there are disposed a plurality of plating equipment, one plating solution preparation unit 150 can sufficiently cope with. That is, since one plating solution preparation unit 150 is enough for one factory or the like, the cost can be reduced.

The steps of plating solution regeneration are further continued to explain. After the above, by operating the pump 172 and releasing the valve 173 disposed in the piping 171 connecting the recycle bath 160 and buffer bath 180, the plating solution of which respective components are readjusted in the recycle bath 160 is transferred to the buffer bath 180 (step 108).

The plating solution transferred to the buffer bath 180 after the readjustment to the prescribed composition, by the action of the pump 185 disposed in the piping 186, is agitated in the buffer bath 180.

Furthermore, the plating solution readjusted to the prescribed composition, by the action of the pump 182 disposed in the piping 181 connected to the buffer bath 180, is forced to go through the third and fourth filters 183a and 183b. Thereby, the impurities such as the decomposition products of the additive agent or the particles that have not been removed by the recycle bath 160 can be removed (step 109).

After the removal of the impurities or the like in the plating solution due to the passage of the plating solution through the third and fourth filters 183a and 183b, by operating the pump 188 and switching the switching valve 189 disposed in the piping 187 connected to the buffer bath 180, the plating solution readjusted to the prescribed composition is supplied to the reservoir tanks 50a and 50b (step 110).

The plating solution reserved in the reservoir tanks 50a and 50b after the readjustment to the prescribed composition, by the action of the pump 51a (51b, ... ) and the release of the valve 52a (52b, ... ) disposed in the piping 48a (48b, ... ), is once more transferred into the plating unit M1 (M2, ... ) (step 111). Thereafter, in the plating unit M1 (M2, ... ), the plating is began as mentioned above.

As explained above, in the present embodiment, the treatment solution (plating solution) that is accommodated in the plating solution bath as the treatment solution bath and implements the liquid treatment (plating) to the substrate to treat (wafer) is circulated between the outside of the treatment solution bath. The reaction products (particles, decomposition products of the additive agent) contained in the circulating treatment solution is removed by the product removal unit (plating solution preparation unit). The reaction products remaining in the treatment solution can be removed and the treatment solution can be prevented from deteriorating, accordingly. As a result, the frequency of discarding the treatment solution as a whole can be largely reduced, resultantly the smooth and high quality liquid treatment being implemented with less manufacturing burden.

The present invention is not restricted to the disclosed content of the present embodiment, the structure or materials, arrangement of the respective members being varied within the scope of the present invention without departing from the spirit of the present invention. For instance, the recycle bath 160, being equipped with the filter 163, the heater 164 and the mesh filter 165 as the means for removing the additive agent and particles in the above, need only to be provided with at least any one of the filter 163 or heater 164.

Furthermore, the plating solution preparation unit 150, though constituted of the recycle bath 160 and the buffer bath 180 in the above, is not necessarily provided with the buffer bath 180. That is, from the recycle bath 160 directly to the respective reservoir tanks 50a and 50b, the readjusted plating solution may be supplied.

Furthermore, in the plating solution regeneration unit, the reservoir tanks 50a and 50b are disposed in the above, but these may not be disposed. That is, from the respective plating units directly to the recycle bath 160, the plating solution may be exhausted. In addition, the plating solution readjusted in the recycle bath 160 may be directly supplied to the respective plating units.

Still furthermore, in the plating equipment, a plurality of plating units are disposed in the above, however it may be one unit. That is, to one plating unit, one set of the plating solution preparation unit 150 may be disposed.

Furthermore, the plating is explained above, however the present embodiment can be applied to any kind of liquid treatment.

In addition, the wafer W is used as the substrate to treat in the above, a LCD glass substrate for liquid crystal display may be used.

(Second Embodiment)

Figure 11:
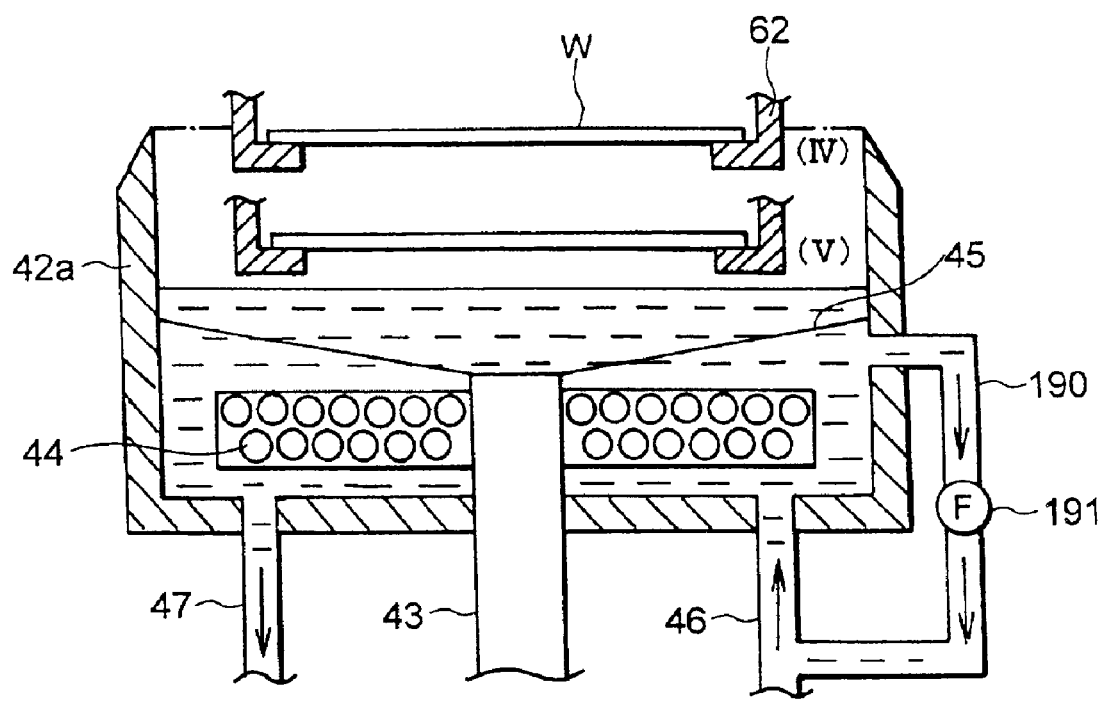
FIG. 11 is a rough vertical section showing schematically a configuration of liquid treatment equipment that is a second embodiment of the present invention.

In the following, a second embodiment of the present invention will be explained with reference to FIG. 11. Of the present embodiment, the content duplicating with the first embodiment is omitted from explanation. FIG. 11 is a schematic vertical section showing a configuration of liquid treatment equipment that is the second embodiment of the present invention. As shown in the same figure, in the present embodiment, below the inner bath 42a the reaction product removal unit is disposed.

To the inner bath 42a of the plating unit M1, one end of piping 190 is connected. Furthermore, the other end thereof 190 is connected to the circulation piping 46, the plating solution exhausted from the inner bath 42a being again returned to the inner bath 42a.

In the piping 190, as the reaction product removal unit, a membrane filter 191 for instance is disposed. For the membrane filter 191, a filter of coarseness capable of capturing the impurities such as for instance the decomposition product of the additive agent contained in the plating solution on the lower side of the inner bath 42a and films essentially consisting of copper oxide formed on the electrode 44, peeled matter of the so-called black film, is used, the coarseness thereof being preferable to be approximately 0.1 µm.

By disposing the membrane filter 191 to the circulation piping 190 connected to the sidewall of the inner bath 42a on the lower side of the membrane 45, the products electrically or naturally decomposed and the peeled matter of the black film can be collected before reaching the membrane 45.

Furthermore, by collecting the decomposition products of the additive agent and the peeled matter of the black film by means of the membrane filter 191, an electric current density in the inner bath 42a becomes uniform, resulting in the formation of a more uniform plating layer on the surface to plate of the wafer W.

In the present second embodiment, as the impurity removal means, the membrane filter is used. However, it is not restricted to the filter or the like such as the membrane filter. That is, by means of sedimentation or centrifugation, the decomposition products and the peeled matter of the black film can be removed.

Furthermore, in the present second embodiment, as the substrate to treat, the wafer W is used. However, LCD glass substrate for liquid crystal display may be used.

(Third Embodiment)

Figure 12:
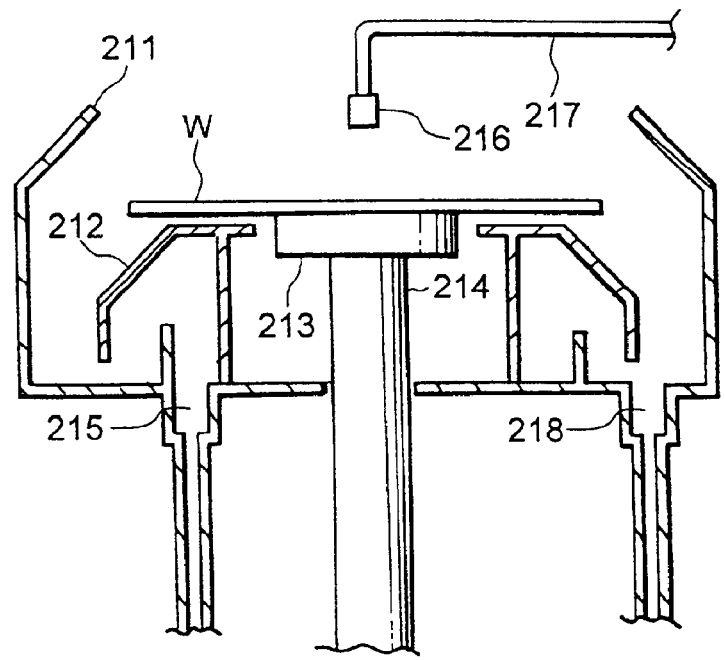
FIG. 12 is a vertical section showing schematically a configuration of equipment implementing a treatment agent coating step used as a third embodiment of the present invention.

FIG. 12 is a vertical section schematically showing a configuration of an apparatus for carrying out the step of coating a treatment agent used as a third embodiment of the present invention. The apparatus applies a treatment agent in liquid from above on a surface of a wafer W to treat. A chemical liquid containing the treatment agent is supplied through a chemical liquid supply pipe 217 by means of a chemical liquid supply nozzle 216 on a surface to treat of a wafer W. In the following explanation of the present embodiment, the "treatment agent" is one that has the identical function with the "additive agent" mentioned in the first and second embodiment.

The wafer W to teat, absorbed and held by a spin chuck 213, is disposed to be freely rotatable due to a level rotation of a spin chuck 214 axis. Due to the rotation of the spin chuck 213, the wafer W to treat is rotated. The chemical liquid supplied by means of the chemical liquid supply nozzle 216 is spread along a radius direction on the surface to treat of the wafer W. Thereby, the chemical liquid can be coated with a definite thickness on the surface to treat of the wafer W.

In the surroundings of the spin chuck 213, an annular inner cup 212 is disposed so as to encircle the spin chuck, the root thereof being fixed to an annular outer cup 211 that encircles the spin chuck 213 and the inner cup 212 to prevent the chemical liquid from scattering.

When the chemical liquid is supplied and spread on the surface of the wafer W to treat, excess chemical liquid is scattered from a brim of the wafer to the outside of the wafer W. The scattered chemical liquid is exhausted from a drain 218. Furthermore, in order to prevent the scattered from spreading as splash outside of the outer cup 211, an air may be introduced from an opening above the outer cup 211 to form an air flow going through to an outfall 215.

Thus, the wafer W to treat on which surface to treat the treatment agent is coated is supplied to the subsequent plating step.

(Fourth Embodiment)

Figure 13:
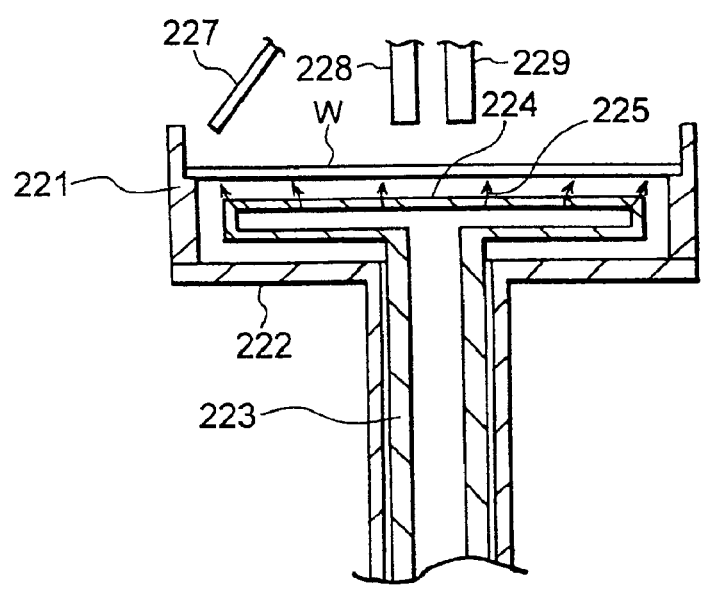
FIG. 13 is a vertical section showing schematically a configuration of equipment implementing a step of treatment agent coating used as a fourth embodiment of the present invention.

FIG. 13 is a vertical section showing schematically a configuration of an apparatus by which the step of coating the treatment agent is carried out, used as a fourth embodiment of the present invention. The apparatus also applies the treatment agent in liquid from above on a surface of the wafer W. Furthermore, the apparatus also serves preferably as an apparatus having a function to cleanse the wafer W to treat after the electroplating.

The coating of the treatment agent is implemented by supplying the treatment agent (chemical liquid) that is liquid from above on a surface to treat of the wafer W by means of the chemical liquid supply nozzle 229. The wafer W is chucked at a periphery thereof by the chuck member 221 held to a rotating cup 222, the rotating cup 222 being rotated to rotate the wafer W in a level direction. The chuck member 221 is designed to have a larger weight at the lower portion thereof, by the centrifugal force due to the rotation of the rotating cup 222 the lower portion thereof being pulled out toward an outside direction of the rotation radius. The upper portion is pulled in toward an inside direction on the contrary to hold assuredly the wafer W.

Due to the rotation of the rotating cup 222, on the surface to treat of the wafer W the chemical liquid is spread to coat the treatment agent.

A brief explanation will be given to the case when the cleaning of the wafer W is implemented after the electroplating. For a front surface to treat of the wafer W, cleaning fluid is supplied from a wafer cleaning nozzle 228 and an edge cleaning nozzle (a bevel cleaning nozzle) 227. Furthermore, for a rear surface of the wafer W, the cleaning fluid is supplied from a rear surface nozzle 225 disposed to a rear surface cleaning member 224 supported by a support member 223. The wafer W thereon the cleaning fluid is supplied is rotated by the rotating cup 222. Thus, the plating solution remaining on the surface of the wafer W is cleansed.

By means of the above apparatus, the wafer W on the surface thereof the treatment agent is coated is supplied to a step of plating that is a subsequent step. In addition, the wafer W after the electroplating is again disposed on the apparatus for cleaning.

(Fifth Embodiment)

FIG. 5 is a vertical section showing schematically a configuration of an apparatus for carrying out the step of treatment agent coating that is used as a fifth embodiment of the present invention. That is, the apparatus is one that implements a step of coating of the treatment agent and also serves as one for carrying out the electroplating mentioned above, applying the treatment agent in liquid from below on the surface of the wafer W.

The step of implementing the electroplating by means of the apparatus has been explained above. Accordingly, further explanation is omitted.

The step of coating the treatment agent in the apparatus will be explained. The coating of the treatment agent is applied before the wafer W is immersed in the plating solution. Accordingly, the wafer W, after transferring in, is first placed at a position (II). Then, from the nozzle 70, the chemical liquid containing the treatment agent is obliquely supplied from below to the surface to treat of the wafer W.

The nozzle 70, as explained above, though for supplying the cleaning fluid on the wafer W after the plating, is effected to function also as one for supplying the chemical liquid. Of course, a nozzle for supplying the chemical liquid may be disposed separately from the cleaning nozzle 70. There are disposed a plurality of the cleaning nozzles 70 in a circumferential direction of the wafer W, therebetween the nozzles for supplying the chemical liquid being able to be disposed.

When supplying obliquely from below the chemical liquid containing the treatment agent onto the surface to treat of the wafer W, it can be implemented while rotating the wafer W by the motor 50. It is because the chemical liquid spreads due to the centrifugal force along a radius direction of the wafer W, thereby enabling to coat more uniformly the surface to treat. Alternatively, the rotation may be implemented at the (IV) position (the position for spin-drying) explained above. Thereby, the chemical liquid scattered due to the rotation can be exhausted from the outfall 71 together with the air.

The wafer W thereon the chemical liquid is supplied is thereafter set at the (V) position and undergoes the plating treatment as explained above.

According to the aforementioned third, fourth and fifth embodiments, in the liquid treatment (plating), the additive agent can be avoided to use as the solution. Accordingly, the burdens of the additive agent concentration management and agitation of the treatment solution (plating solution) can be reduced. As a result, the smooth and high quality liquid treatment can be implemented with less burden of manufacturing. In addition, as to the treatment solution, there is no need of considering the deterioration of the additive agent. Accordingly, while largely reducing the frequency of discarding the treatment solution as a whole, the smooth and high quality liquid treatment can be implemented with less manufacturing burden.

(Sixth Embodiment)

Next, an apparatus for carrying out a step of reducing the wafer to treat will be explained with reference to FIG. 14. The figure is a front section showing schematically a configuration of an apparatus carrying out a step of the reduction as the sixth embodiment of the present invention.

The apparatus is an air-tight cylindrical aluminum reaction chamber 241 electrically grounded. A sidewall thereof can be cooled by means of cooling water or the like. Above the reaction chamber 241, a setting plate 253 thereon the wafer 242 can be set with the surface to treat directed downwardly is disposed. The setting plate 253 is made of for instance quartz glass. Above the setting plate 253, a cylindrical supporter 250 is erected supporting the setting plate 253 at a contact with the setting plate along a periphery thereof. The supporter 250 is conductive but insulated cylindrically by an insulating member from the chamber 241. The supporter 250 can be electrically connected to a power source of plasma excitation frequency, thereby being used as a plasma generation electrode.

In the neighborhood of the setting plate 253, so as to fix the wafer to the setting plate by the use of a periphery of the wafer 242, a supporter 247 provided with an elevating unit 249 such as for instance an air cylinder is disposed. Above the setting plate 253, an infrared lamp (omitted from the drawing) capable of rapid heating the wafer 242 disposed on the setting plate 253 through a quartz window 251 can be disposed.

In an upper wall of the reaction chamber 241 in the neighborhood of the setting plate 253, at two positions for instance, outfalls 248 and 252 are disposed. To these outfalls 248 and 252, a pump (omitted from showing in the drawing) capable of evacuating the reaction chamber 241 to a desired pressure and of exhausting reaction gases or the like is connected.

Below the reaction chamber 241, two lines of annular gas inlets 244 and 245 having a number of fine outfalls for outgoing the gas are disposed. These gas inlets 244 and 245 are connected to a gas supplier (omitted from showing).

Between the setting plate 253 and the gas inlets 244 and 245, a disc-like baffle plate 243 is disposed to regulate gas flow and moved linearly by means of a movement unit 246.

To one sidewall of the reaction chamber 241, a gate valve 254 is disposed to open and close automatically, a hand arm 255 being disposed there to send the wafer 242 in and out of the reaction chamber 241 through the gate valve 254.

Steps of reducing the wafer 242 will be explained.

The wafer 242 to reduce is sent, by means of the hand arm 255 through the gate valve 254, in the reaction chamber 241. At that time, by means of the elevating unit 249, the supporter 247 is held at an approximate middle of the reaction chamber 241, thereon 247 the wafer 242 to reduce being delivered. Thereafter, the hand arm 255 and the gate valve 254 are returned to an initial state to recover the airtightness of the reaction chamber 241.

The wafer 242 delivered on the supporter 247 is fixed to the setting plate 253 by means of the elevating unit 249. Then, from one or both of the gas inlets 244 and 245, a reducing gas (for instance hydrogen gas) is introduced into the reaction chamber 241. At that time, if necessary, the pressure in the reaction chamber 241 is previously adjusted by means of a pump connected to the outfalls 248 and 252. Furthermore, if it is necessary to heat rapidly, it is possible to heat by means of the infrared lamp through the quartz glass window 251. Furthermore, the disc-like baffle plate 243 can be linearly moved by means of the movement unit 246 to regulate the gas flow.

After reducing for a prescribed time period, due to the reversed step from that for setting the wafer 242 on the setting plate 253, the wafer 242 is sent out of the reaction chamber 241.

By implementing such reduction of the wafer to treat, the time management after the formation of the seed layer on the wafer is made unnecessary. Accordingly, without the burden of the time management after the formation of the seed layer, the plating can be carried out smoothly and with high quality.

(Seventh Embodiment)

Next, an embodiment where plating equipment is configured by systemizing the plating treatment including the apparatuses for implementing the steps of coating the treatment agent and of reducing the wafer is explained with reference to FIGS. 1 through 4. These drawings have been explained above of the configuration, only the portion peculiar to the present embodiment being explained.

In systemizing the plating treatment, the treatment agent coating unit such as explained in FIG. 12, when introducing, is disposed at a position different from that for the cleaning unit and above any one of the plating units M1 through M4. In addition, when the treatment agent coating unit such as explained in FIG. 13 is introduced, since the unit can be concurrently used with the cleaning unit, there is no need of a new space in particular.

Furthermore, also when the treatment agent coating unit such as explained in FIG. 5 is introduced, since the unit is concurrently used with the plating unit, there is no need of a particular new space.

Figure 14:
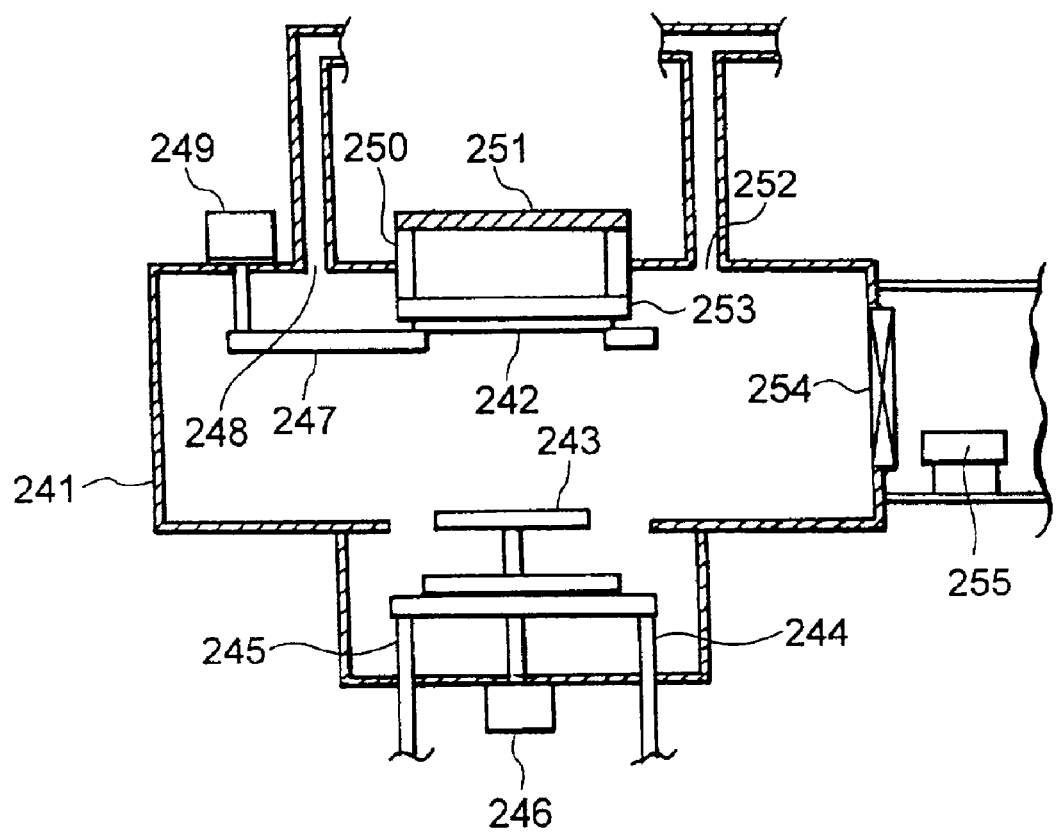
FIG. 14 is a vertical section showing schematically a configuration of equipment for implementing a step of reduction treatment used as a sixth embodiment of the present invention.

Still furthermore, when the reduction unit such as explained in FIG. 14 is introduced into the present system, it is also disposed at a position different from that for the cleaning unit and above any one of the plating units M1 through M4.

Figure 15:
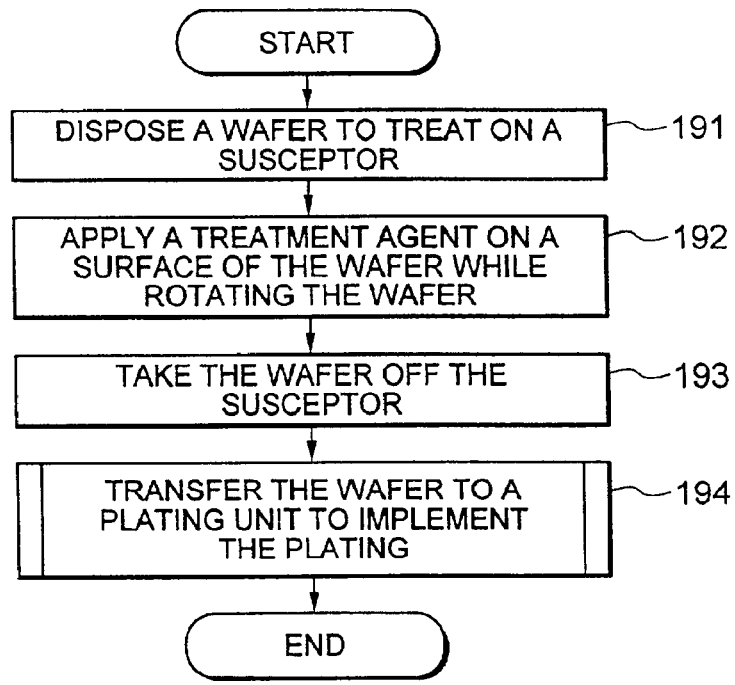
FIG. 15 is a flow chart showing the steps of a system when equipment shown in FIG. 12 or 13 is introduced as a treatment agent coating unit.

The steps of the plating equipment when the apparatus shown in FIG. 12 or 13 is introduced as the treatment agent coating unit will be explained with reference to FIG. 15. FIG. 15 is a flow chart showing the steps of the plating equipment when, as the treatment agent coating unit, the apparatus shown in FIG. 12 or 13 is introduced.

First, the wafer to treat is disposed on the treatment agent coating unit (step 191), then, while rotating the wafer, the treatment agent being applied on the surface of the wafer (step 192). After the treatment agent is supplied on the surface of the wafer, it is taken off the susceptor (step 193) and sent to the plating unit. At the plating unit, as already explained in FIG. 5, the plating is implemented (step 194). The explanation of the steps when, as the treatment agent coating unit, the apparatus shown in FIG. 5 is introduced, being duplicating with that of FIG. 5 already explained, is omitted.

Figure 16:
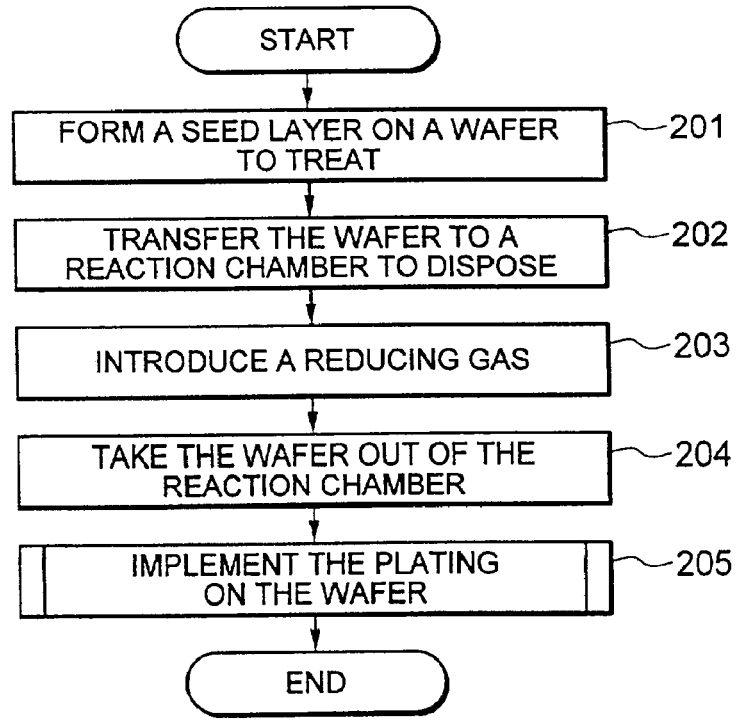
FIG. 16 is a flow chart showing the steps of a system when reduction treatment equipment is introduced.

Next, the steps of the plating equipment when the apparatus for implementing the reduction such as shown in FIG. 14 is introduced will be explained with reference to FIG. 16. FIG. 16 is a flow chart showing the steps of the plating equipment when the apparatus for implementing the reduction as shown in FIG. 14 is introduced.

First, the seed layer is formed on the wafer to treat (step 201). The step can be implemented by means of for instance PVD or CVD method. The technology itself, being well known, is not particularly detailed here. Furthermore, whether the treatment due to the PVD or CVD method is included in the aforementioned plating equipment or not is arbitrary. When including, the PVD or CVD unit can be disposed at a position different from that for the cleaning unit or the like and above any one of the plating units M1 through M4. When not including, the wafer treated by a separate PVD or CVD unit is introduced through the carrier station 2 into the treatment space S.

Next, the wafer is transferred in the reaction chamber to dispose (step 202) and the reducing gas is introduced therein (step 203). The wafer, after the reduction is over, is stopped to react further and taken out of the reaction chamber (step 204). Then, the wafer is transferred to the plating unit. At the plating unit, as explained in FIG. 5, the plating is implemented (step 205).

Figure 17:
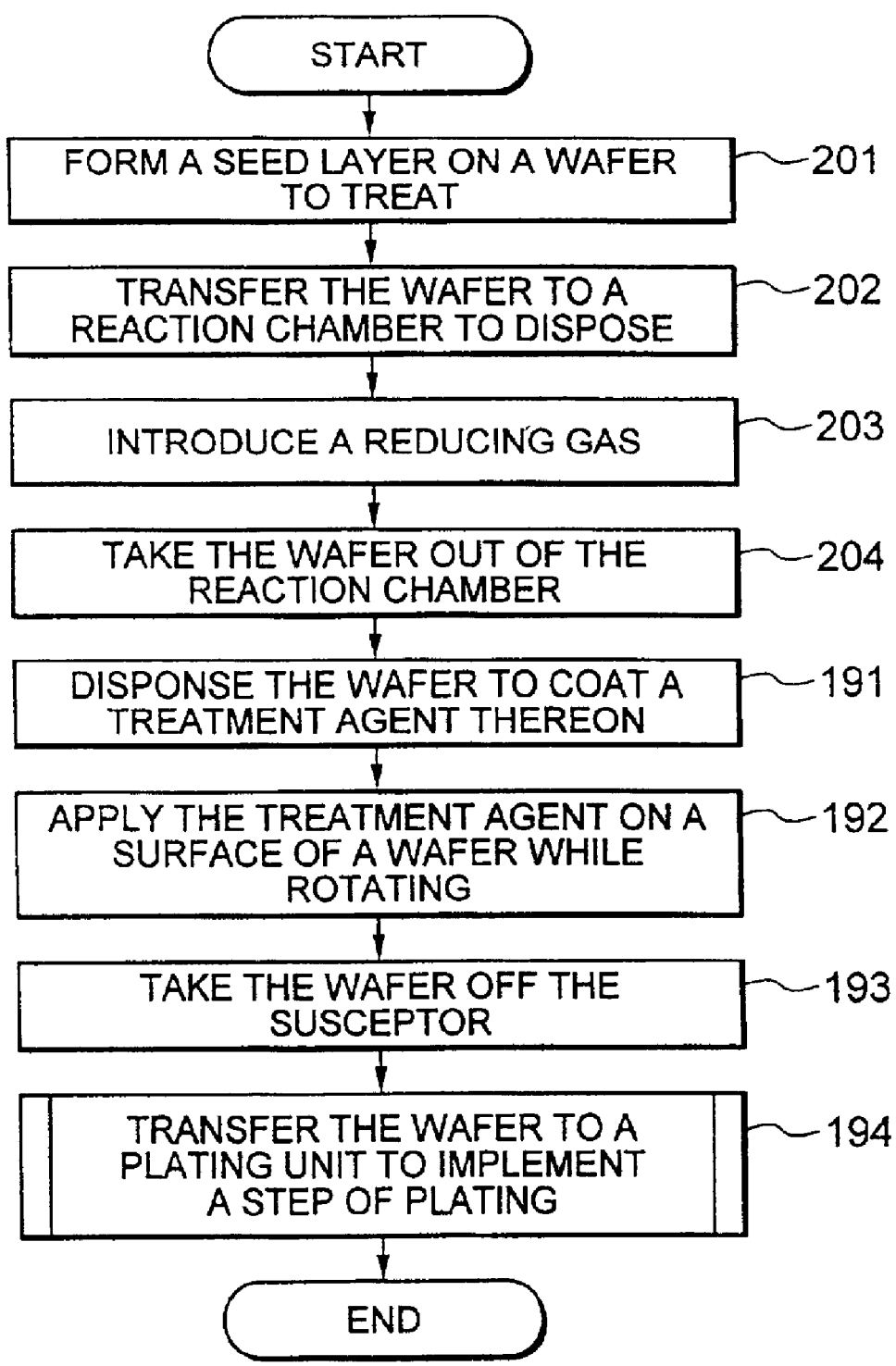
FIG. 17 is a flow chart showing the steps of a system when both reduction treatment and additive agent coating are applied.

Needless to say, both the reduction and treatment agent coating may be applied. The steps of the plating equipment at that time are as shown in FIG. 17. The same figure is a flowchart showing the steps in the plating equipment when both the reduction and treatment agent coating are applied, the same codes being given to the same functions with the steps explained in FIGS. 15 and 16.

As detailed above, according to the present invention, the treatment solution for implementing the liquid treatment to the substrate to treat accommodated in the treatment solution bath is circulated between the outside of the treatment solution bath, the reaction products contained in the circulating treatment solution being removed at the product removal unit. Accordingly, the chemical change substances and decomposition products can be removed, resulting in the prevention of the deterioration of the treatment solution. As a result, the frequency of discarding the treatment solution as a whole can be largely reduced, to that extent with less manufacturing burden the smooth and high quality liquid treatment being implemented.

Furthermore, according to the invention, in the liquid treatment, the additive agent can be avoided to use as a solution, accordingly with reduced burden of additive agent concentration management of the treatment solution and agitation thereof, the smooth and high quality liquid treatment being implemented with less manufacturing burden. In addition, since, as to the treatment solution, there is no need of considering the deterioration of the additive agent, the frequency of discarding the treatment solution as a whole can be largely reduced, resulting in the smooth and high quality liquid treatment with less manufacturing burden.

In addition, according to the present invention, due to the reduction of the seed layer, the time management after the formation of the seed layer is made unnecessary. As a result, without the burden of the time management after the formation of the seed layer, the smooth and high quality liquid treatment is made possible.

What is claimed is:

1. Liquid treatment equipment comprising:
   a treatment solution bath capable of accommodating a treatment solution including a metallic ion for implementing liquid treatment of a substrate;
   a treatment solution circulating system, connected to the treatment solution bath, that circulates the accommodated treatment solution between the treatment solution bath and an outside of the treatment solution bath;
   a product removal unit, disposed in the treatment solution circulating system, that includes an electric absorbing unit to absorb a reaction product due to the liquid treatment contained in the circulated treatment solution and a heating unit to heat the circulated treatment solution, and wherein the product removal unit removes the reaction product except the metallic ion; and
   an additive agent supplier, connected to the treatment solution circulating system, that supplies in the circulated treatment solution an organic component additive agent and/or a sulfur component additive agent.

2. The liquid treatment equipment as set forth in claim 1, further comprising:
   an additive agent concentration measuring unit, disposed connected to the treatment solution circulating system, that measures a concentration of an organic component additive agent and/or a sulfur component additive agent in the circulated treatment solution.

3. The liquid treatment equipment as set forth in claim 1, further comprising:
   a volume/weight measuring unit, disposed in the treatment solution circulating system, that measures a volume or weight of the circulated treatment solution.

4. Liquid treatment equipment, comprising:
   a treatment solution bath accommodating a treatment solution including a metallic ion for implementing liquid treatment to a substrate to treat;
   a treatment solution circulating system, connected to the treatment solution bath, that circulates the accommodated treatment solution between the treatment solution bath and an outside of the treatment solution bath;
   a recycle bath, disposed in a middle of the treatment solution circulating system, that is capable of reserving the circulated treatment solution and implements recycle treatment to the reserved treatment solution;
   a product removal portion, disposed in the recycle bath, that includes and electric absorbing unit to absorb a reaction product due to the liquid treatment contained in the circulated treatment solution and heating unit to heat the circulated treatment solution and, wherein the product removal portion removes the reaction product except the metallic ion; and
   an additive agent supplier, connected to the treatment solution circulating system, that supplies in the circulated treatment solution an organic component additive agent and/or a sulfur component additive agent.

5. The liquid treatment equipment as set forth in claim 4, further comprising:
   a reservoir tank, disposed in the treatment solution circulating system on a way from the treatment solution bath to the recycle bath, that temporarily reserves the circulated treatment solution.

6. The liquid treatment equipment as set forth in claim 4, further comprising:

a buffer bath, disposed in the treatment solution circulating system on a way from the recycle bath to the treatment solution bath, that temporarily reserves the circulated treatment solution.

7. A liquid treatment method employing liquid treatment equipment comprising a treatment solution bath capable of accommodating a treatment solution including a metallic ion for implementing liquid treatment to a substrate to treat, a treatment solution circulating system connected to the treatment solution bath and circulating the accommodated treatment solution between the treatment solution bath and an outside of the treatment solution bath, a product removal unit disposed in the treatment solution circulating system and including an electric absorbing unit to absorb a reaction product due to the liquid treatment contained in the circulated treatment and a heating unit to heat the circulated treatment solution and removing the reaction product except the metallic ion, and an additive agent supplier, connected to the treatment solution circulating system, that supplies in the circulated treatment solution an organic component additive agent and/or a sulfur component additive agent, the method comprising:

circulating the treatment solution by means of the treatment solution circulating system while or after implementing the liquid treatment to the substrate to treat; and removing the reaction product except the metallic ion due to the liquid treatment contained in the circulated treatment solution by means of the product removal unit.

* * * * *